(12) United States Patent
Huang

(10) Patent No.: US 11,088,140 B2
(45) Date of Patent: Aug. 10, 2021

(54) MULTIPLE SEMICONDUCTOR ELEMENTS WITH DIFFERENT THRESHOLD VOLTAGES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/552,260

(22) Filed: Aug. 27, 2019

(65) Prior Publication Data
US 2021/0066303 A1 Mar. 4, 2021

(51) Int. Cl.
*H01L 27/108* (2006.01)

(52) U.S. Cl.
CPC .. *H01L 27/10814* (2013.01); *H01L 27/10852* (2013.01); *H01L 27/10885* (2013.01); *H01L 27/10888* (2013.01); *H01L 27/10891* (2013.01); *H01L 27/10897* (2013.01)

(58) Field of Classification Search
CPC ......... H01L 27/10814; H01L 27/10852; H01L 27/10897; H01L 27/1104; H01L 27/11546
See application file for complete search history.

(56) References Cited

U.S. PATENT DOCUMENTS

| 9,960,170 | B1* | 5/2018 | Kim | H01L 27/10814 |
| 2011/0102968 | A1* | 5/2011 | Choi | H01L 23/53261 |
| | | | | 361/305 |
| 2017/0323954 | A1* | 11/2017 | Tsai | H01L 29/0649 |
| 2019/0148237 | A1* | 5/2019 | Wang | H01L 29/4966 |
| | | | | 257/288 |
| 2020/0328215 | A1* | 10/2020 | Chu | H01L 27/10897 |

FOREIGN PATENT DOCUMENTS

| EP | 0417484 B1 | 3/1991 |
| JP | 2001332709 A | 11/2001 |
| KR | 20130019242 A | 2/2013 |
| TW | 200903726 A | 1/2009 |

OTHER PUBLICATIONS

Office Action dated Dec. 8, 2020 in TW Application No. 109113308, 8 pages.

* cited by examiner

*Primary Examiner* — Hoai V Pham
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate comprising an array region and a peripheral region surrounding the array region, a plurality of capacitor structures positioned above the peripheral region of the substrate, a first semiconductor element positioned above the peripheral region and having a first threshold voltage, and a second semiconductor element positioned above the peripheral region and having a second threshold voltage. The first threshold voltage of the first semiconductor element is different from the second threshold voltage of the second semiconductor element.

8 Claims, 38 Drawing Sheets

MULTIPLE SEMICONDUCTOR ELEMENTS WITH DIFFERENT THRESHOLD VOLTAGES

TECHNICAL FIELD

The present disclosure relates to a semiconductor device and a method for fabricating the semiconductor device, and more particularly, to a semiconductor device with multiple threshold voltages and a method for fabricating the semiconductor device with multiple threshold voltages.

DISCUSSION OF THE BACKGROUND

Semiconductor devices are used in a variety of electronic applications, such as personal computers, cell phones, digital cameras, and other electronic equipment. In addition, demand is rising for more sophisticated designs of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate comprising an array region and a peripheral region surrounding the array region, a plurality of capacitor structures positioned above the peripheral region of the substrate, a first semiconductor element positioned above the peripheral region and having a first threshold voltage, and a second semiconductor element positioned above the peripheral region and having a second threshold voltage. The first threshold voltage of the first semiconductor element is different from the second threshold voltage of the second semiconductor element.

In some embodiments, the first semiconductor element comprises a first insulating layer and a first bottom conductive layer positioned above the first insulating layer, the second semiconductor element comprises a second insulating layer and a second bottom conductive layer positioned above the second insulating layer, a thickness of the first insulating layer is between about 0.1 nm and about 2.0 nm, and a thickness of the second insulating layer is between about 0.1 nm and about 2.0 nm.

In some embodiments, a thickness of the first bottom conductive layer is between about 1.0 nm and about 3.0 nm, and a thickness of the second bottom conductive layer is between about 1.0 nm and about 3.0 nm.

In some embodiments, the first semiconductor element further comprises a first dipole layer positioned below the first insulating layer, the second semiconductor element further comprises a second dipole layer positioned below the second insulating layer, a thickness of the first dipole layer is between about 0.1 nm and about 1.0 nm, and a thickness of the second dipole layer is between about 0.1 nm and about 1.0 nm.

In some embodiments, the first semiconductor element further comprises a plurality of first spacers, the plurality of first spacers cover sidewalls of the first insulating layer, sidewalls of the first bottom conductive layer, and sidewalls of the first dipole layer, and the plurality of first spacers are formed of an insulating material having a dielectric constant of about 4.0 or greater.

In some embodiments, the plurality of capacitor structures comprise a plurality of capacitor bottom electrodes inwardly positioned above the array region of the substrate, a capacitor insulating layer positioned on the plurality of capacitor bottom electrodes, and a capacitor top electrode positioned on the capacitor insulating layer.

In some embodiments, the semiconductor device further comprises an isolation layer positioned in the substrate, wherein the isolation layer is formed of silicon oxide, silicon nitride, silicon oxynitride, or silicon nitride oxide.

In some embodiments, the semiconductor device further comprises a plurality of bit lines positioned in the array region of the substrate.

In some embodiments, the plurality of bit lines comprise a plurality of bit line contacts positioned in an upper portion of the array region of the substrate, a plurality of bit line bottom electrodes positioned above the plurality of bit line contacts, a plurality of bit line top electrodes positioned above the plurality of bit line bottom electrodes, a plurality of bit line mask patterns positioned above the plurality of bit line top electrodes, and a plurality of bit line spacers covering sidewalls of the plurality of bit line contacts, sidewalls of the plurality of bit line bottom electrodes, sidewalls of the plurality of bit line top electrodes, and sidewalls of the plurality of bit line mask patterns.

In some embodiments, the semiconductor device further comprises a plurality of word line insulating layers inwardly positioned in the array region of the substrate, a plurality of word line barrier layers positioned on the plurality of word line insulating layers, a plurality of word line electrodes positioned on the plurality of word line barrier layers, and a plurality of word line capping layers positioned above the plurality of word line barrier layers and the plurality of word line electrodes.

Another aspect of the present disclosure provides a method for fabricating a semiconductor device including providing a substrate comprising an array region and a peripheral region surrounding the array region, forming a first semiconductor element positioned above the peripheral region and having a first threshold voltage and a second semiconductor element positioned above the peripheral region and having a second threshold voltage, and forming a plurality of capacitor structures positioned above the peripheral region of the substrate. The first threshold voltage of the first semiconductor element is different from the second threshold voltage of the second semiconductor element.

In some embodiments, a first insulating layer and a first bottom conductive layer positioned above the first insulating layer, the second semiconductor element comprises a second insulating layer and a second bottom conductive layer positioned above the second insulating layer, a thickness of the first insulating layer is between about 0.1 nm and about 2.0 nm, and a thickness of the second insulating layer is between about 0.1 nm and about 2.0 nm.

In some embodiments, a thickness of the first bottom conductive layer is between about 1.0 nm and about 3.0 nm, and a thickness of the second bottom conductive layer is between about 1.0 nm and about 3.0 nm.

In some embodiments, the first semiconductor element further comprises a first dipole layer positioned below the first insulating layer, the second semiconductor element further comprises a second dipole layer positioned below the second insulating layer, a thickness of the first dipole layer is between about 0.1 nm and about 1.0 nm, and a thickness of the second dipole layer is between about 0.1 nm and about 1.0 nm.

In some embodiments, the method further comprises comprising performing an anneal process at a temperature ranging from about 200° C. to about 800° C.

In some embodiments, the plurality of capacitor structures comprise a plurality of capacitor bottom electrodes inwardly positioned above the array region of the substrate, a capacitor insulating layer positioned on the plurality of capacitor bottom electrodes, and a capacitor top electrode position on the capacitor insulating layer.

In some embodiments, the method further comprises forming an isolation layer in the substrate, wherein the isolation layer is formed of silicon oxide, silicon nitride, silicon oxynitride, or silicon nitride oxide.

In some embodiments, the method further comprises forming a plurality of bit lines in the array region of the substrate.

In some embodiments, the plurality of bit lines comprise a plurality of bit line contacts positioned in an upper portion of the array region of the substrate, a plurality of bit line bottom electrodes positioned above the plurality of bit line contacts, a plurality of bit line top electrodes positioned above the plurality of bit line bottom electrodes, a plurality of bit line mask patterns positioned above the plurality of bit line top electrodes, and a plurality of bit line spacers covering sidewalls of the plurality of bit line contacts, sidewalls of the plurality of bit line bottom electrodes, sidewalls of the plurality of bit line top electrodes, and sidewalls of the plurality of bit line mask patterns.

In some embodiments, the method further comprises forming a plurality of word line insulating layers inwardly positioned in the array region of the substrate, a plurality of word line barrier layers positioned on the plurality of word line insulating layers, a plurality of word line electrodes positioned on the plurality of word line barrier layers, and a plurality of word line capping layers positioned above the plurality of word line barrier layers and the plurality of word line electrodes.

Due to the design of the semiconductor device, the multiple threshold voltage property of the semiconductor device may broaden the applicability of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
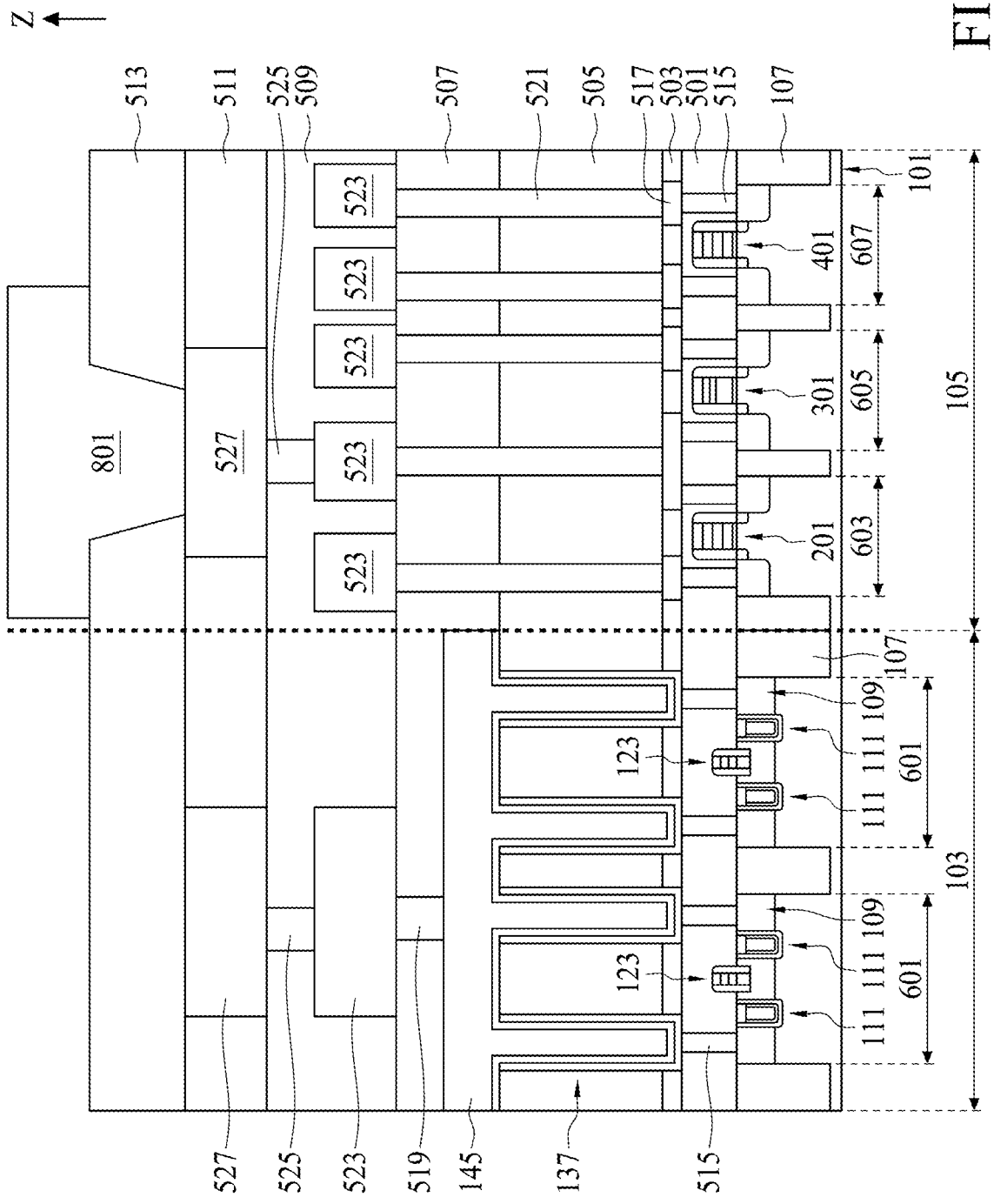
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Figure 2:
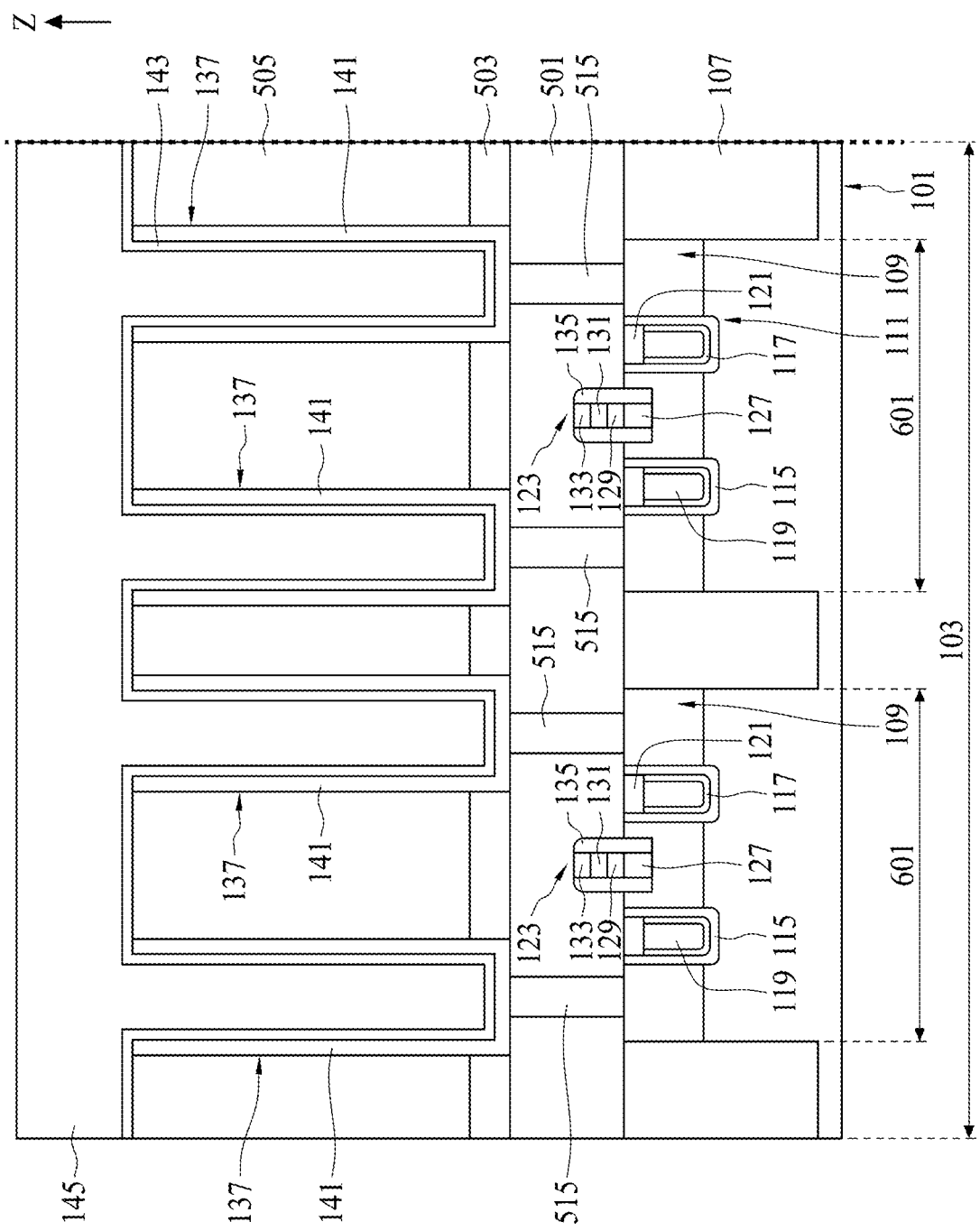
FIGS. 2 and 3 illustrate, in schematic cross-sectional diagrams, part of the semiconductor device in accordance with FIG. 1.
Figure 3:
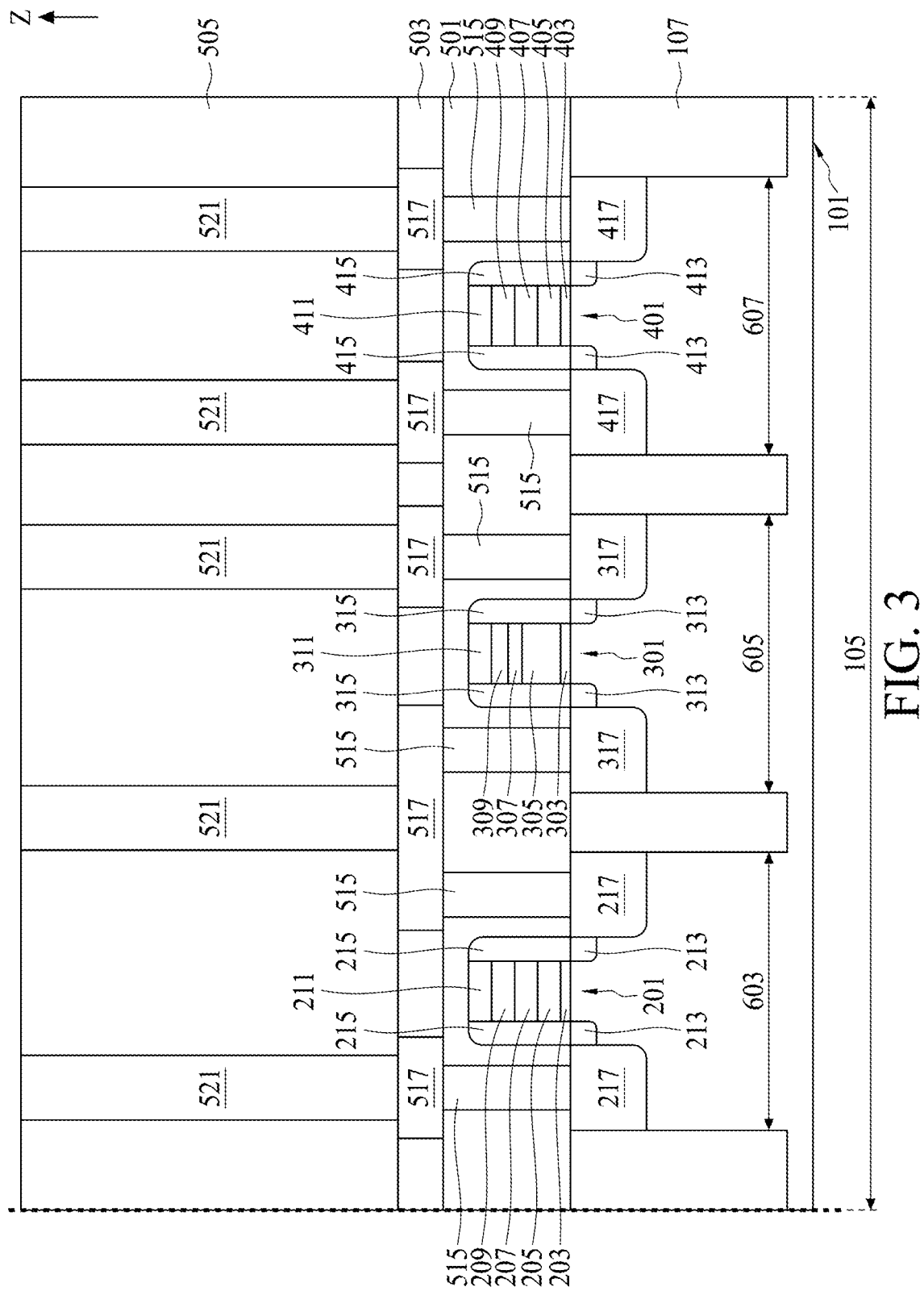

With reference to FIGS. 1 to 3, the semiconductor device may include a substrate 101, an isolation layer 107, a plurality of array doped regions 109, a plurality of word lines 111, a plurality of bit lines 123, a plurality of capacitor structures 137, a plurality of semiconductor elements, a plurality of insulating films, a plurality of conductive interconnections, and a solder unit 801.

With reference to FIGS. 1 to 3, the substrate 101 may include an array region 103 and a peripheral region 105. The peripheral region 105 may surround the array region 103. The substrate 101 may be formed of silicon, germanium, silicon germanium, silicon carbon, silicon germanium carbon, gallium, gallium arsenic, indium arsenic, indium phosphorus or other IV-IV, II-V or II-VI semiconductor materials.

With reference to FIGS. 1 to 3, the isolation layer 107 may be disposed in the substrate 101 and define a plurality of active regions of the substrate 101. The plurality of active regions may include first active regions 601, a second active region 603, a third active region 605, and a fourth active region 607. The first active regions 601 may be disposed in the array region 103 of the substrate 101 and may be separated from each other by the isolation layer 107. The second active region 603, the third active region 605, and the fourth active region 607 may be disposed in the peripheral region 105 and may be separated from each other by the isolation layer 107. The isolation layer 107 may be formed of an insulating material such as silicon oxide, silicon nitride, silicon oxynitride, silicon nitride oxide, or fluoride-doped silicate. It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, the plurality of array doped regions 109 may be disposed in an upper portion of the first active regions 601. The plurality of array doped regions 109 may be doped with a dopant such as phosphorus, arsenic, or antimony.

With reference to FIGS. 1 to 3, the plurality of word lines 111 may be disposed in the upper portion of the first active regions 601. The plurality of word lines 111 may be electrically coupled to a device, such as a power source, that can generate a current across the plurality of word lines 111. The plurality of word lines 111 may include a plurality of word line insulating layers 115, a plurality of word line barrier layers 117, a plurality of word line electrodes 119, and a plurality of word line capping layers 121. In the embodiment depicted, each of the first active regions 601 may have two word lines 11l disposed therein.

With reference to FIGS. 1 to 3, the plurality of word line insulating layers 115 may be inwardly disposed in the upper portion of the first active regions 601. The plurality of word line insulating layers 115 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. A thickness of the plurality of word line insulating layers 115 may be between about 0.5 nanometer (nm) and about 10 nm. Alternatively, in another embodiment, the insulating material may be silicon oxide, silicon nitride, silicon oxynitride, silicon nitride oxide, or the like. Bottoms of the plurality of word line insulating layers 115 may be flat. The bottoms of the plurality of word line insulating layers 115 may be between about 0.1 nm and about 50 nm lower than the bottoms of the plurality of array doped regions 109.

With reference to FIGS. 1 to 3, the plurality of word line barrier layers 117 may be respectively correspondingly disposed on the plurality of word line insulating layers 115. The plurality of word line barrier layers 117 may be formed of titanium, titanium nitride, titanium silicon nitride, tantalum, tantalum nitride, tantalum silicon nitride, or a combination thereof. Thicknesses of the plurality of word line barrier layers 117 may be between about 30 angstroms and about 200 angstroms. The plurality of word line barrier layers 117 may improve adhesion between the plurality of word line insulating layers 115 and the plurality of word line electrodes 119.

With reference to FIGS. 1 and 2, the plurality of word line electrodes 119 may be respectively correspondingly disposed on the plurality of word line barrier layers 117. The plurality of word line electrodes 119 may be formed of a conductive material such as polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. Thicknesses of the plurality of word line electrodes 119 may be between about 50 nm and about 500 nm.

With reference to FIGS. 1 to 3, the plurality of word line capping layers 121 may be respectively correspondingly disposed on the plurality of word line electrodes 119 and the plurality of word line barrier layers 117. Top surfaces of the plurality of word line capping layers 121 may be at a same vertical level as a top surface of the substrate 101. Sidewalls of the plurality of word line capping layers 121 may respectively correspondingly directly contact upper portions of inner surfaces of the plurality of word line insulating layers 115. Alternatively, in another embodiment, the plurality of word line barrier layers 117 may be disposed adjacent to the top surface of the substrate 101, and the sidewalls of the plurality of word line capping layers 121 may respectively correspondingly directly contact upper portions of inner surfaces of the plurality of word line barrier layers 117. The plurality of word line capping layers 121 may be formed of a single layer including an insulating material having a dielectric constant of about 4.0 or greater.

With reference to FIGS. 1 to 3, the plurality of bit lines 123 may be disposed in the upper portion of the first active regions 601. In the embodiment depicted, each of the plurality of bit lines 123 may be disposed between an adjacent pair of the plurality of word lines 111. The plurality of bit lines 123 may be electrically coupled to current sense amplifiers, and thereby to a power or voltage source. The plurality of bit lines 123 may include a plurality of bit line contacts 127, a plurality of bit line bottom electrodes 129, a plurality of bit line top electrodes 131, a plurality of bit line mask patterns 133, and a plurality of bit line spacers 135.

With reference to FIGS. 1 to 3, the plurality of bit line contacts 127 may be disposed in the upper portion of the first active regions 601 and respectively correspondingly between adjacent pairs of the plurality of word lines 111. Sidewalls of the plurality of bit line contacts 127 may be separated from the substrate 101. Top surfaces of the plurality of bit line contacts 127 may be at the same vertical level as the top surface of the substrate 101. The plurality of bit line contacts 127 may be electrically coupled to the plurality of array doped regions 109 disposed between adjacent pairs of the plurality of word lines 111. The plurality of bit line contacts 127 may be formed of a conductive material such as doped polysilicon, metal, metal nitride, or metal silicide.

With reference to FIGS. 1 to 3, the plurality of bit line bottom electrodes 129 may be respectively correspondingly disposed on the plurality of bit line contacts 127. The plurality of bit line bottom electrodes 129 may be formed of doped polysilicon. The plurality of bit line bottom electrodes 129 may be respectively correspondingly electrically connected to the plurality of bit line contacts 127. The plurality of bit line top electrodes 131 may be respectively correspondingly disposed on the plurality of bit line bottom electrodes 129. The plurality of bit line top electrodes 131 may be formed of a conductive material such as tungsten, aluminum, copper, nickel, or cobalt. The plurality of bit line top electrodes 131 may be respectively correspondingly electrically connected to the plurality of bit line bottom electrodes 129.

With reference to FIGS. 1 to 3, the plurality of bit line mask patterns 133 may be respectively correspondingly disposed on the plurality of bit line top electrodes 131. The plurality of bit line mask patterns 133 may be formed of silicon oxide, silicon nitride, silicon oxynitride, or silicon nitride oxide. The plurality of bit line spacers 135 may respectively correspondingly cover sidewalls of the plurality of bit line mask patterns 133, sidewalls of the plurality of bit line top electrodes 131, sidewalls of plurality of bit line bottom electrodes 129, and the sidewalls of the plurality of bit line contacts 127. Sidewalls of the plurality of bit line spacers 135 opposite to the sidewalls of the plurality of bit line contacts 127 may respectively correspondingly directly contact the substrate 101. The plurality of bit line spacers 135 may be formed of silicon oxide, silicon nitride, silicon oxynitride, or silicon nitride oxide.

With reference to FIGS. 1 to 3, the plurality of semiconductor elements may be disposed on the peripheral region 105 of the substrate 101. Specifically, the plurality of semiconductor elements may be respectively correspondingly disposed on the second active region 603, the third active region 605, and the fourth active region 607 in the peripheral region 105 of the substrate 101. The plurality of semiconductor elements may include a first semiconductor element 201, a second semiconductor element 301, and a third semiconductor element 401. The first semiconductor element 201 may be disposed on the second active region 603 in the peripheral region 105 of the substrate 101. The first semiconductor element 201 may include a first interfacial layer 203, a first insulating layer 205, a first bottom conductive layer 207, a first top conductive layer 209, a first capping layer 211, a plurality of first lightly doped regions 213, a plurality of first spacers 215, and a plurality of first doped regions 217. The first semiconductor element 201 may have a first threshold voltage.

With reference to FIGS. 1 to 3, the first interfacial layer 203 may be disposed on the second active region 603 in the peripheral region 105 of the substrate 101. The first interfacial layer 203 may be formed of silicon oxide. A thickness of the first interfacial layer 203 may be no greater than 2.0 nm. Preferably, the thickness of the first interfacial layer 203 may be no greater than 0.5 nm. The first insulating layer 205 may be disposed above the first interfacial layer 203. Specifically, the first insulating layer 205 may be disposed on the first interfacial layer 203. The first insulating layer 205 may be formed of an insulating material having a dielectric constant of about 4.0 or greater. A thickness of the first insulating layer 205 may be between about 0.1 nm and about 2.0 nm. Preferably, the thickness of the first insulating layer 205 may be between about 0.1 nm and about 1.0 nm.

With reference to FIGS. 1 to 3, the first bottom conductive layer 207 may be disposed above the first insulating layer 205. Specifically, the first bottom conductive layer 207 may be disposed on the first insulating layer 205. The first bottom conductive layer 207 may be formed of a conductive material including at least one of titanium nitride, tantalum nitride, titanium silicon nitride, titanium tantalum nitride, tungsten nitride, and titanium tantalum silicon nitride. A thickness of the first bottom conductive layer 207 may be between about 1.0 nm and about 3.0 nm. The first top conductive layer 209 may be disposed above the first bottom conductive layer 207. Specifically, the first top conductive layer 209 may be disposed on the first bottom conductive layer 207. The first top conductive layer 209 may be formed of tungsten or cobalt.

With reference to FIGS. 1 to 3, the first capping layer 211 may be disposed above the first top conductive layer 209. Specifically, the first capping layer 211 may be disposed on the first top conductive layer 209. The first capping layer 211 may be formed of an insulating material such as silicon oxide, silicon nitride, silicon oxynitride, silicon nitride oxide, or fluoride-doped silicate. Alternatively, in another embodiment, the insulating material may have a dielectric constant of about 4.0 or greater. The plurality of first lightly doped regions 213 may respectively correspondingly abut two edges of the first interfacial layer 203 and may be disposed in an upper portion in the peripheral region 105 of the substrate 101. The plurality of first lightly doped regions 213 may be opposite to each other with the first interfacial layer 203 interposed therebetween. The plurality of first lightly doped regions 213 may be doped with a dopant such as phosphorus, arsenic, or antimony.

With reference to FIGS. 1 to 3, the plurality of first spacers 215 may cover sidewalls of the first capping layer 211, sidewalls of the first top conductive layer 209, sidewalls of the first bottom conductive layer 207, sidewalls of the first insulating layer 205, and sidewalls of the first interfacial layer 203, and may be disposed on the peripheral region 105 of the substrate 101. The plurality of first spacers 215 may be disposed above the plurality of first lightly doped regions 213. The plurality of first spacers 215 may be formed of silicon oxide, silicon nitride, silicon oxynitride, or silicon nitride oxide. Alternatively, the plurality of first spacers 215 may be formed of an insulating material having a dielectric constant of about 4.0 or greater. The plurality of first spacers 215 formed of the insulating material having the dielectric constant of about 4.0 or greater may help to increase the vertical electric field above the plurality of first lightly doped regions 213 to increase the anti-hot electron capability of the first semiconductor element 201.

With reference to FIGS. 1 to 3, the plurality of first doped regions 217 may abut lower edges of the plurality of first spacers 215 and may be disposed in the upper portion of the peripheral region 105 of the substrate 101. The plurality of first doped regions 217 may be doped with a dopant such as phosphorus, arsenic, or antimony. A dopant concentration of the plurality of first doped regions 217 may be greater than a dopant concentration of the plurality of first lightly doped regions 213. Bottoms of the plurality of first doped regions 217 may be at a vertical level lower than a vertical level of bottoms of the plurality of first lightly doped regions 213.

With reference to FIGS. 1 to 3, the second semiconductor element 301 may be disposed on the third active region 605. The second semiconductor element 301 may include a second interfacial layer 303, a second insulating layer 305, a second bottom conductive layer 307, a second top conductive layer 309, a second capping layer 311, a plurality of second lightly doped regions 313, a plurality of second spacers 315, and a plurality of second doped regions 317. A structure of the second semiconductor element 301 may be similar to a structure of the first semiconductor element 201 except the thickness and/or material of the second insulating layer 305, the second bottom conductive layer 307, and the second top conductive layer 309 are respectively different from the thickness and/or material of the first insulating layer 205, the first bottom conductive layer 207, and the first top conductive layer 209. Hence, the second semiconductor element 301 may have a second threshold voltage different from the first threshold voltage of the first semiconductor element 201. In addition, the plurality of second lightly doped regions 313 and the plurality of second doped regions 317 may be doped by boron.

With reference to FIGS. 1 to 3, the third semiconductor element 401 may be disposed on the fourth active region 607. The third semiconductor element 401 may include a third interfacial layer 403, a third insulating layer 405, a third bottom conductive layer 407, a third top conductive layer 409, a third capping layer 411, a plurality of third lightly doped regions 413, a plurality of third spacers 415, and a plurality of third doped regions 417. A structure of the third semiconductor element 401 may be similar to the structure of the first semiconductor element 201 except the thickness and/or material of the third insulating layer 405, the third bottom conductive layer 407, and the third top conductive layer 409 are respectively different from the thickness and/or material of the first insulating layer 205, the first bottom conductive layer 207, and the first top conductive layer 209. Hence, the third semiconductor element 401 may have a third threshold voltage different from the first threshold voltage of the first semiconductor element 201. In addition, the third threshold voltage of the third semiconductor element 401 may be different from the second threshold voltage of the second semiconductor element 301, but the disclosure is not limited thereto.

With reference to FIGS. 1 to 3, the plurality of insulating films may be disposed above both the array region 103 of the substrate 101 and the peripheral region 105 of the substrate 101. The plurality of conductive interconnections may be disposed among the plurality of insulating films. The plurality of insulating films may include a first insulating film 501, a second insulating film 503, a third insulating film 505, a fourth insulating film 507, a fifth insulating film 509, a sixth insulating film 511, and a seventh insulating film 513. The plurality of conductive interconnections may include a plurality of first conductive plugs 515, a plurality of landing pads 517, a second conductive plug 519, a plurality of third conductive plugs 521, a plurality of first conductive layers 523, a plurality of fourth conductive plugs 525, and a plurality of second conductive layers 527. The plurality of insulating films may be formed of silicon nitride, silicon oxide, silicon oxynitride, flowable oxide, undoped silica glass, borosilica glass, phosphosilica glass, borophosphosilica glass, fluoride silicate glass, carbon-doped silicon oxide, amorphous fluorinated carbon, or a combination thereof, but the disclosure is not limited thereto.

With reference to FIGS. 1 to 3, the first insulating film 501 may be disposed above both the array region 103 of the substrate 101 and the peripheral region 105 of the substrate 101. Specifically, the first insulating film 501 may be disposed on the both of the array region 103 of the substrate 101 and the peripheral region 105 of the substrate 101. The first insulating film 501 may cover the plurality of bit lines 123 and the first semiconductor element 201, the second semiconductor element 301, and the third semiconductor element 401. The plurality of first conductive plugs 515 may be disposed in the first insulating film 501. The plurality of first conductive plugs 515 may be respectively correspondingly electrically connected to the plurality of array doped regions 109, the plurality of first doped regions 217, the plurality of second doped regions 317, and the plurality of third doped regions 417. The plurality of first conductive plugs 515 may be formed of doped polysilicon, titanium, titanium nitride, tantalum, tantalum nitride, tungsten, copper, aluminum or aluminum alloy.

With reference to FIGS. 1 to 3, the second insulating film 503 may be disposed on the first insulating film 501. The plurality of landing pads 517 may be disposed in the second insulating film 503 of the peripheral region 105. The plurality of landing pads 517 may be respectively correspondingly electrically connected to the plurality of first conductive plugs 515 of the peripheral region 105. The plurality of landing pads 517 may be formed of a same material as the plurality of first conductive plugs 515, but the disclosure is not limited thereto. The third insulating film 505 may be disposed on the second insulating film 503. The fourth insulating film 507 may be disposed on the third insulating film 505. The plurality of capacitor structures 137 may be disposed in the third insulating film 505 and the fourth insulating film 507. The plurality of capacitor structures 137 may include a plurality of capacitor bottom electrodes 141, a capacitor insulating layer 143, and a capacitor top electrode 145.

With reference to FIGS. 1 to 3, the plurality of capacitor bottom electrodes 141 may be inwardly disposed in the fourth insulating film 507 and the third insulating film 505. The plurality of capacitor bottom electrodes 141 may be formed of doped polysilicon, metal, or metal silicide. The plurality of capacitor bottom electrodes 141 may be respectively correspondingly electrically connected to the plurality of first conductive plugs 515 of the array region 103. The capacitor insulating layer 143 may be disposed on the plurality of capacitor bottom electrodes 141. The capacitor insulating layer 143 may be formed of a single layer including an insulating material having a dielectric constant of about 4.0 or greater. A thickness of the capacitor insulating layer 143 may be between about 1 angstrom and about 100 angstroms. Alternatively, in another embodiment, the capacitor insulating layer 143 may be formed of a stacked layer consisting of silicon oxide, silicon nitride, and silicon oxide.

With reference to FIGS. 1 to 3, the capacitor top electrode 145 may be disposed on the capacitor insulating layer 143. The capacitor top electrode 145 may be formed of doped polysilicon or metal. The metal may be aluminum, copper, or tungsten. The second conductive plug 519 may be disposed above the capacitor top electrode 145. Specifically, the second conductive plug 519 may be disposed in the fourth insulating film 507 and on the capacitor top electrode 145. The second conductive plug 519 may be electrically connected to the capacitor top electrode 145. The second conductive plug 519 may be formed of a same material as the plurality of first conductive plugs 515, but the disclosure is not limited thereto.

With reference to FIGS. 1 to 3, the plurality of third conductive plugs 521 may be disposed passing through the third insulating film 505 and the fourth insulating film 507 and respectively correspondingly electrically connected to the plurality of landing pads 517. The plurality of third conductive plugs 521 may be formed of a same material as the plurality of first conductive plugs 515, but the disclosure is not limited thereto. The fifth insulating film 509 may be disposed on the fourth insulating film 507. The plurality of first conductive layers 523 may be disposed in the fifth insulating film 509 and respectively correspondingly electrically connected to the plurality of third conductive plugs 521 and the second conductive plug 519. The plurality of first conductive layers 523 may be formed of aluminum or copper.

With reference to FIGS. 1 to 3, the plurality of fourth conductive plugs 525 may be disposed in the fifth insulating film 509 and on the plurality of first conductive layers 523. The plurality of fourth conductive plugs 525 may be respectively correspondingly electrically connected to the plurality of first conductive layers 523. The plurality of fourth conductive plugs 525 may be formed of aluminum, copper, tungsten, cobalt, or other suitable metal or metal alloy. The sixth insulating film 511 may be disposed on the fifth insulating film 509. The plurality of second conductive layers 527 may be disposed in the sixth insulating film 511 and on the plurality of fourth conductive plugs 525. The plurality of second conductive layers 527 may be respectively correspondingly electrically connected to the plurality of fourth conductive plugs 525. The plurality of second conductive layers 527 may be formed of aluminum or copper.

With reference to FIGS. 1 to 3, the seventh insulating film 513 may be disposed on the sixth insulating film 511. The solder unit 801 may be disposed in the seventh insulating film 513 and an upper portion of the solder unit 801 may be disposed on the seventh insulating film 513. The solder unit 801 may be disposed on the plurality of second conductive layers 527 and respectively correspondingly electrically connected to the plurality of second conductive layers 527. The solder unit 801 may be formed of tin-silver alloy, tin-copper alloy, or the like.

Figure 4:
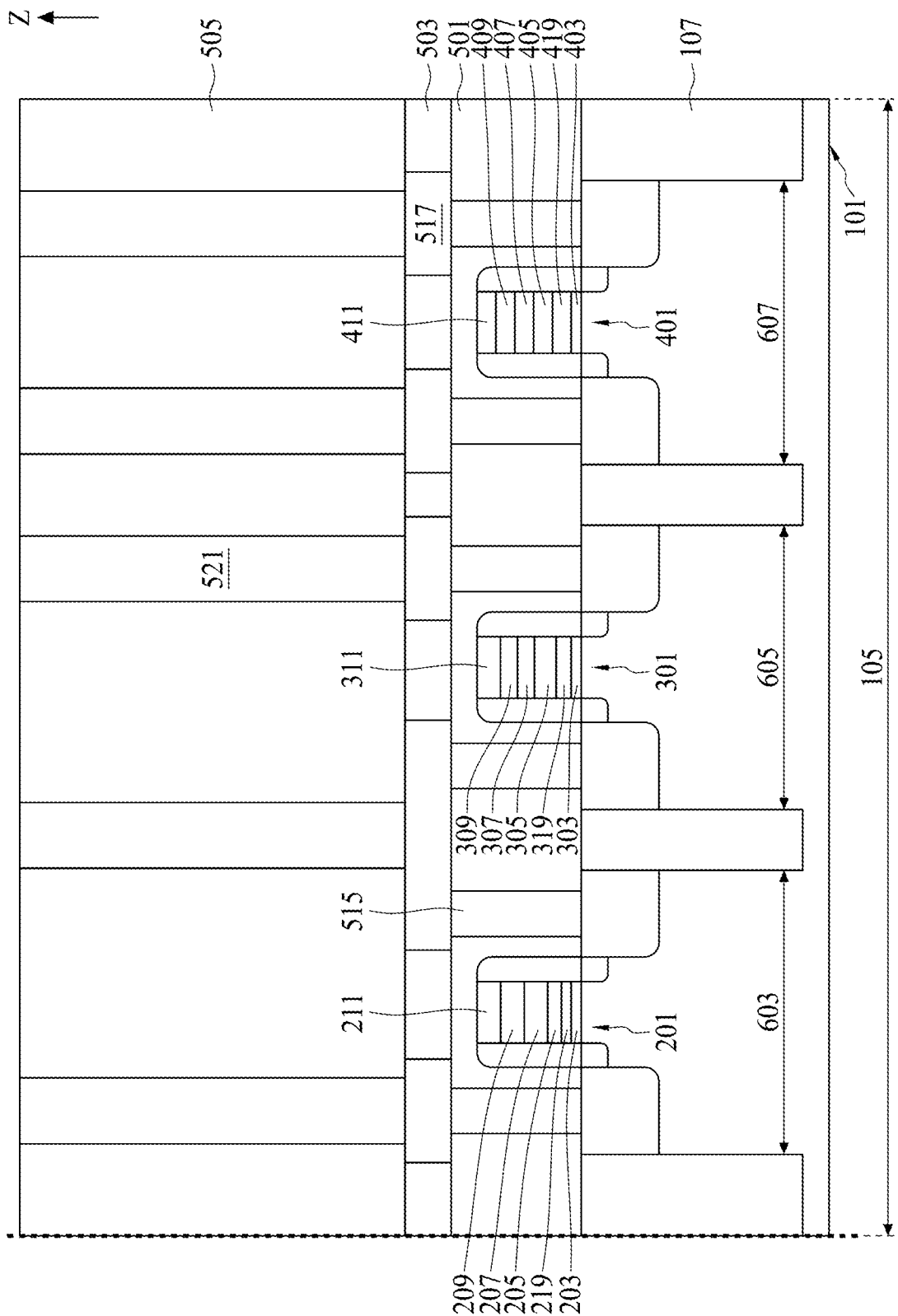
FIG. 4 illustrates, in a schematic cross-sectional diagram, a semiconductor device in accordance with another embodiment of the present disclosure.

With reference to FIG. 4, the first semiconductor element 201 may further include a first dipole layer 219, the second semiconductor element 301 may further include a second dipole layer 319, and the third semiconductor element 401 may further include a third dipole layer 419. The first dipole layer 219 may be disposed between the first interfacial layer 203 and the first insulating layer 205. The second dipole layer 319 may be disposed between the second interfacial layer 303 and the second insulating layer 305. The third dipole layer 419 may be disposed between the third interfacial layer 403 and the third insulating layer 405. Thicknesses of the first dipole layer 219, the second dipole layer 319, and the third dipole layer 419 may be between about 0.1 nm and about 1.0 nm. The first dipole layer 219, the second dipole layer 319, and the third dipole layer 419 may include one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide.

The presence of the first dipole layer 219, the second dipole layer 319, and the third dipole layer 419 may be used to adjust the first threshold voltage of the first semiconductor element 201, the second threshold voltage of the second semiconductor element 301, and the third threshold voltage of the third semiconductor element 401, respectively; in other words, the presence of the first dipole layer 219, the second dipole layer 319, and the third dipole layer 419 may add another method of tuning the threshold voltage in addition to the thickness or material of the first insulating layer 205, the first bottom conductive layer 207, and the first top conductive layer 209 of the first semiconductor element 201, the second insulating layer 305, the second bottom conductive layer 307, and the second top conductive layer 309 of the second semiconductor element 301, and the third insulating layer 405, the third bottom conductive layer 407, and the third top conductive layer 409 of the third semiconductor element 401.

For example, the first dipole layer 219 may be formed of one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, magnesium oxide, and magnesium silicon oxide, and the first dipole layer 219 may shift the first threshold voltage downward (negatively).

Figure 5:
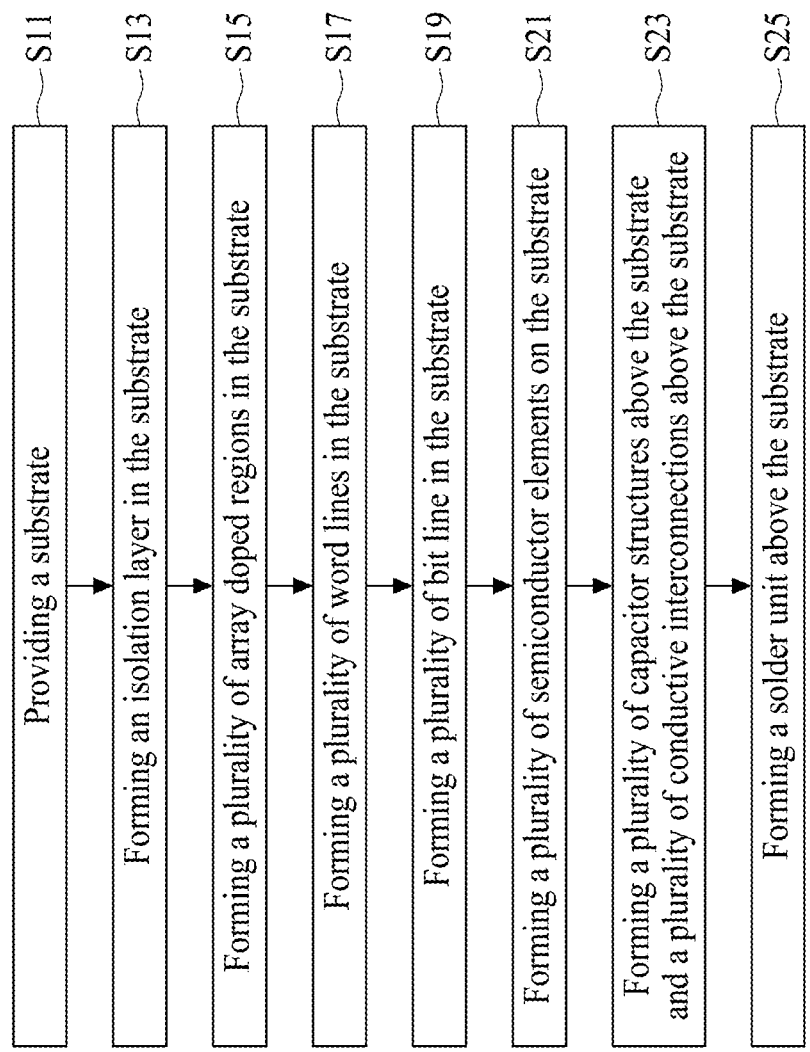
FIG. 5 illustrates, in a flowchart diagram, a method for fabricating a semiconductor device in accordance with one embodiment of the present disclosure.
Figure 6:
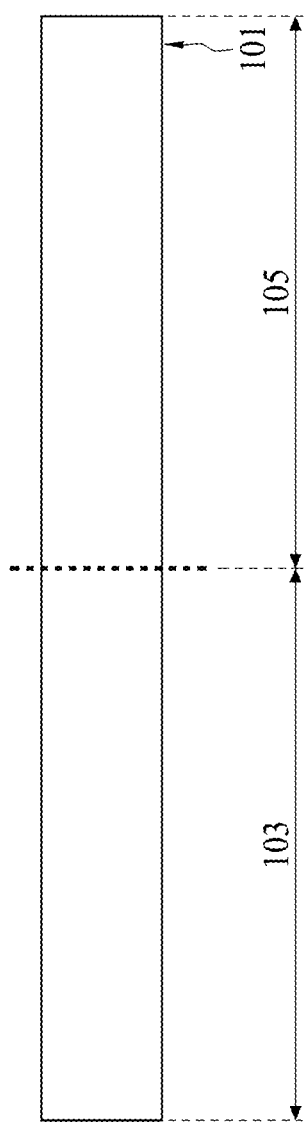
FIGS. 6 to 38 illustrate, in schematic cross-sectional diagrams, a flow of fabricating a semiconductor device in accordance with one embodiment of the present disclosure.

With reference to FIGS. 5 and 6, at step S11, a substrate 101 may be provided. The substrate 101 may include an array region 103 and a peripheral region 105. The peripheral region 105 may surround the array region 103.

Figure 7:
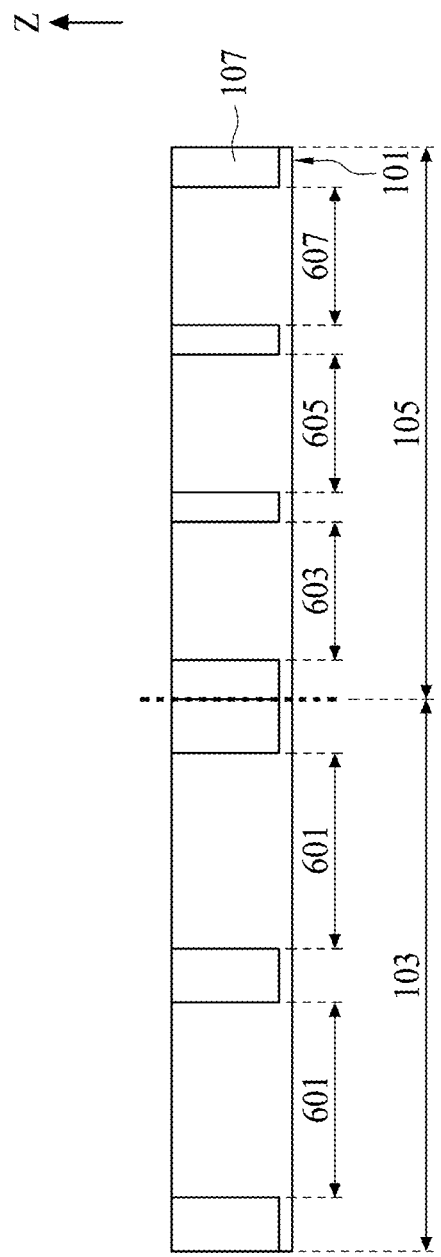

With reference to FIGS. 5 and 7, at step S13, an isolation layer 107 may be formed in the substrate 101. The isolation layer 107 may define a plurality of active regions of the substrate 101. The plurality of active regions may include first active regions 601, a second active region 603, a third active region 605, and a fourth active region 607. The first active regions 601 may be disposed in the array region 103 of the substrate 101 and may be separated from each other by the isolation layer 107. The second active region 603, the third active region 605, and the fourth active region 607 may be disposed in the peripheral region 105 and may be separated from each other by the isolation layer 107.

Figure 8:
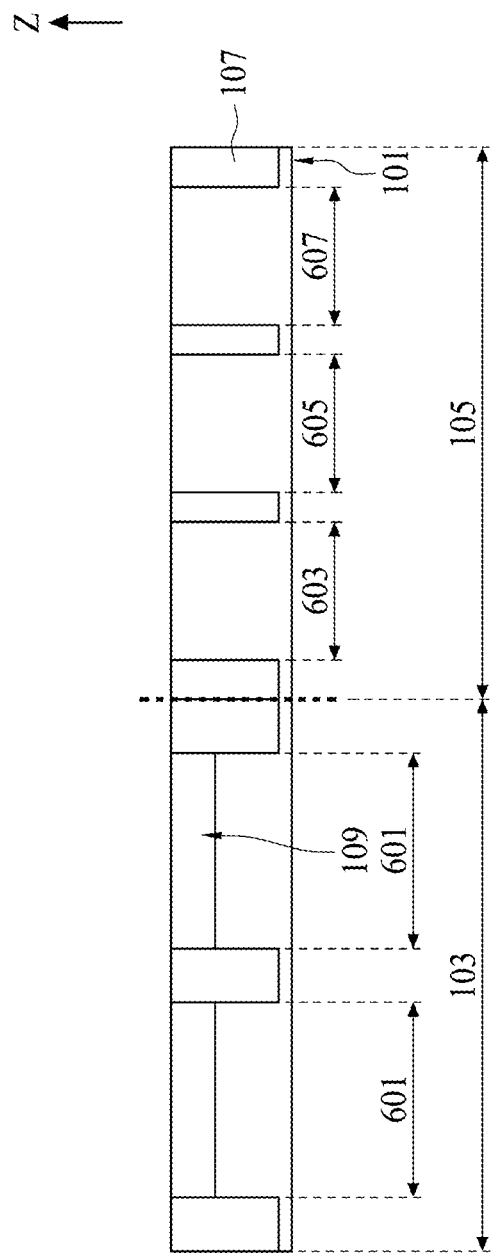

With reference to FIGS. 5 and 8, at step S15, a plurality of array doped regions 109 may be formed in an upper portion of the first active regions 601 in the array region 103 of the substrate 101. The plurality of array doped regions 109 may be doped with a dopant such as phosphorus, arsenic, or antimony using an implantation process.

Figure 9:
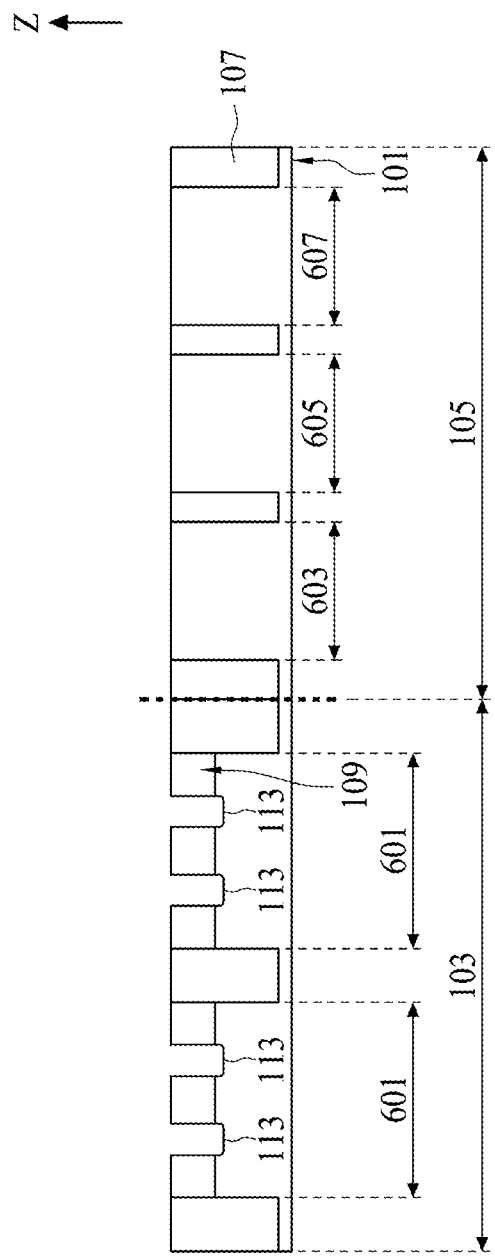

With reference to FIG. 5 and FIGS. 9 to 13, at step S17, a plurality of word lines 111 may be formed in the upper portion of the first active regions 601 in the array region 103 of the substrate 101. With reference to FIG. 9, a plurality of word line trenches 113 may be formed inwardly in the upper portion of the first active regions 601 in the array region 103 of the substrate 101. Bottoms of the plurality of word line trenches 113 may be flat. The bottoms of the plurality of word line trenches 113 may be slightly lower than bottoms of the plurality of array doped regions 109.

Figure 10:
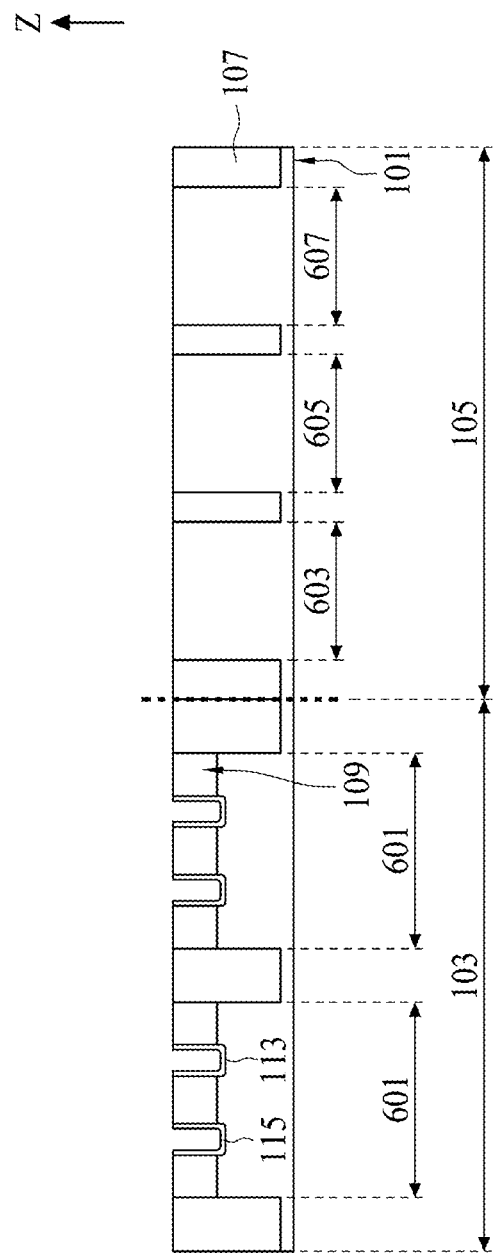

With reference to FIG. 10, a plurality of word line insulating layers 115 may be respectively correspondingly formed in the plurality of word line trenches 113. In other words, the plurality of word line insulating layers 115 may be inwardly formed in the upper portion of the first active regions 601. A deposition process may be performed to deposit a layer formed of the insulating material to form the plurality of word line insulating layers 115 in the plurality of word line trenches 113. A planarization process, such as chemical mechanical polishing, may be performed after the deposition process to remove excess filling material and provide a substantially flat surface for subsequent processing steps. In addition, the layer formed of the insulating material may also cover a top surface of the peripheral region 105 of the substrate 101 (not shown), and may be turned into interfacial layers or insulating layers of a plurality of semiconductor elements which will be discussed later.

Figure 11:
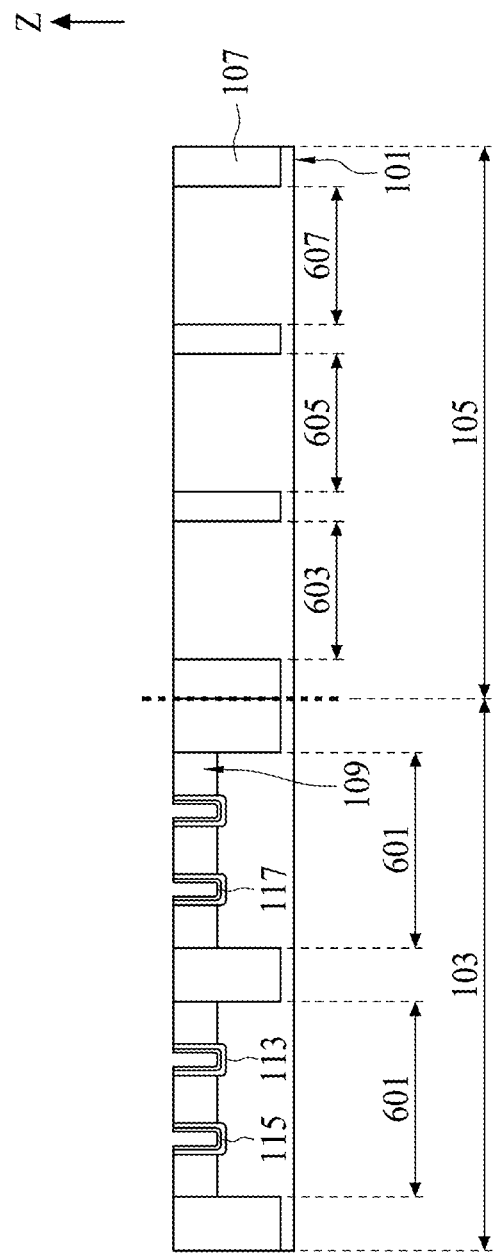

With reference to FIG. 11, a plurality of word line barrier layers 117 may be respectively correspondingly formed on the plurality of word line insulating layers 115 in the plurality of word line trenches 113. A deposition process may be performed to deposit a layer formed of titanium, titanium nitride, titanium silicon nitride, tantalum, tantalum nitride, tantalum silicon nitride or a combination thereof to form the plurality of word line barrier layers 117. A planarization process, such as chemical mechanical polishing, may be performed after the deposition process to remove excess filling material and provide a substantially flat surface for subsequent processing steps. In addition, the layer formed of the insulating material may also cover the peripheral region 105 of the substrate 101 (not shown) and may be turned into bottom conductive layers of a plurality of semiconductor elements, as will be discussed later.

Figure 12:
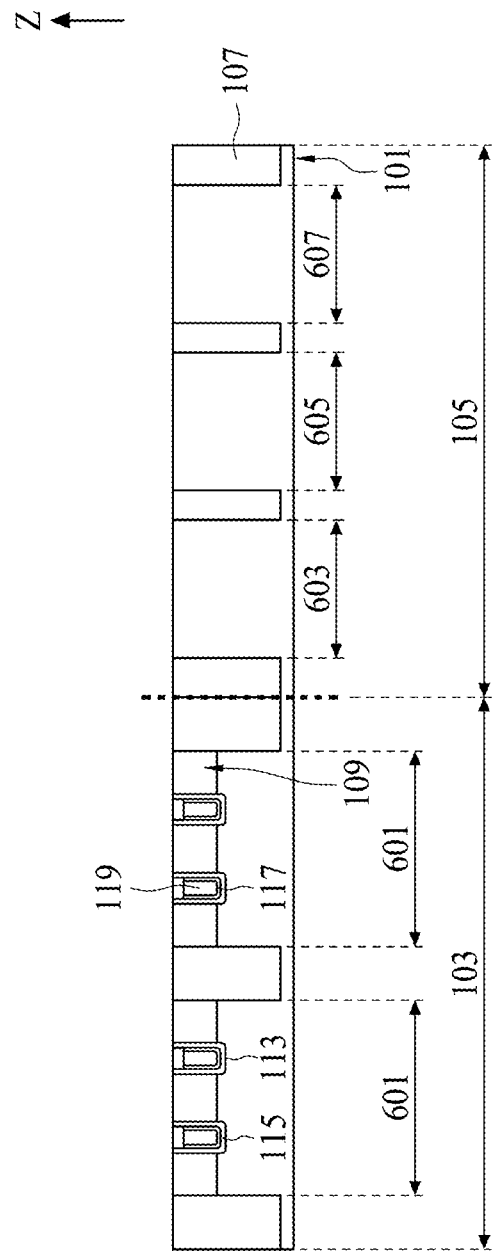
Figure 13:
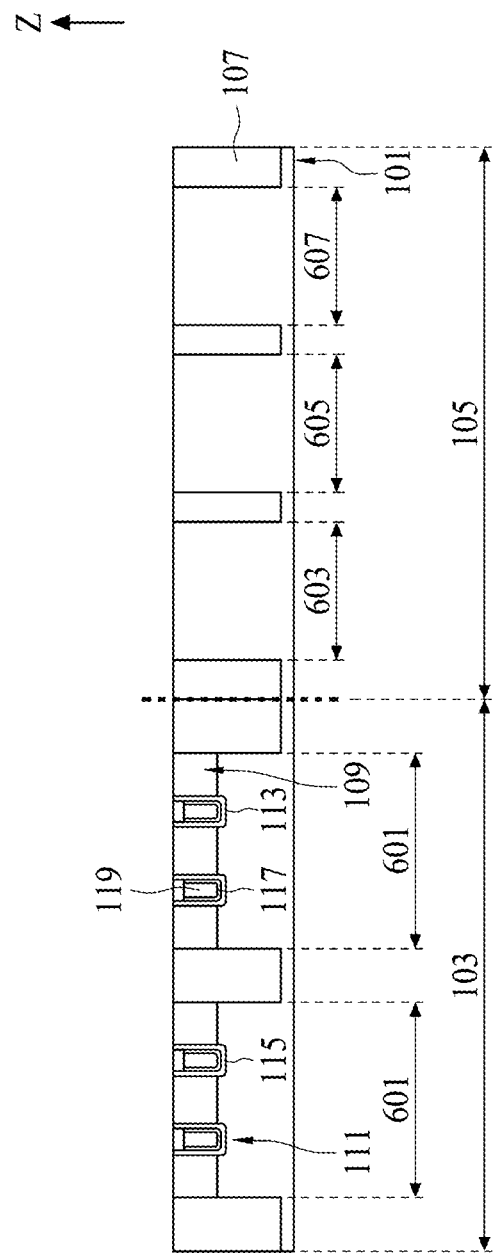

With reference to FIG. 12, a plurality of word line electrodes 119 may be respectively correspondingly formed on the plurality of word line barrier layers 117 in the plurality of word line trenches 113. The plurality of word line barrier layers 117 may improve adhesion between the plurality of word line insulating layers 115 and the plurality of word line electrodes 119. With reference to FIG. 13, a plurality of word line capping layers 121 may be respectively correspondingly formed on the plurality of word line electrodes 119 and the plurality of word line barrier layers 117. Sidewalls of the plurality of word line capping layers 121 may respectively correspondingly directly contact upper portions of inner surfaces of the plurality of word line insulating layers 115.

Figure 14:
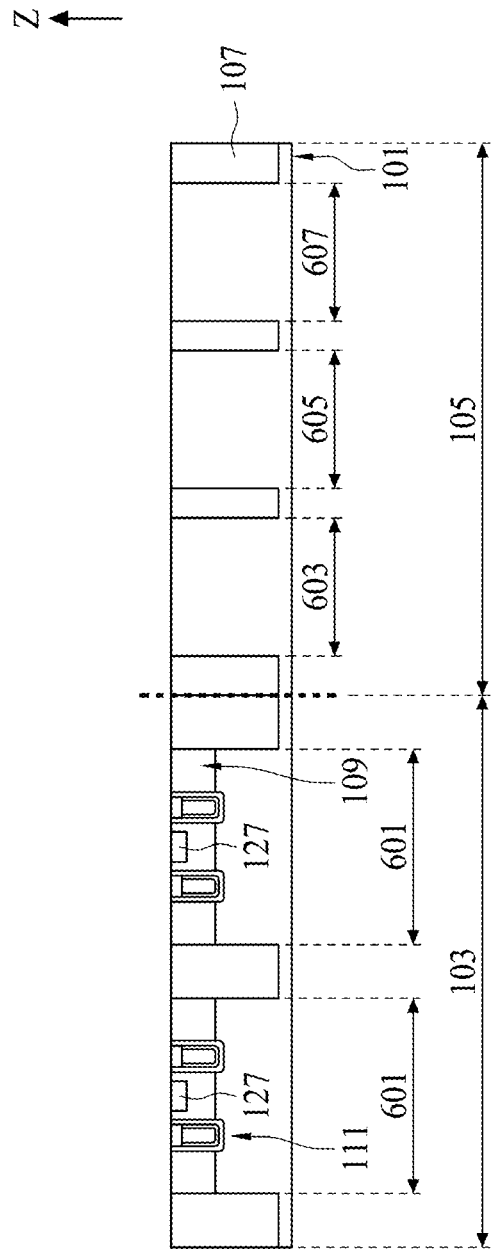

With reference to FIG. 5 and FIGS. 14 to 18, at step S19, a plurality of bit lines 123 may be formed in the upper portion of the first active regions 601. With reference to FIG. 14, a plurality of bit line contacts 127 may be formed in the upper portion of the first active regions 601 and respectively correspondingly formed between adjacent pairs of the plurality of word lines 111. The plurality of bit line contacts 127 may be electrically coupled to the plurality of array doped regions 109 disposed between adjacent pairs of the plurality of word lines 111.

Figure 15:
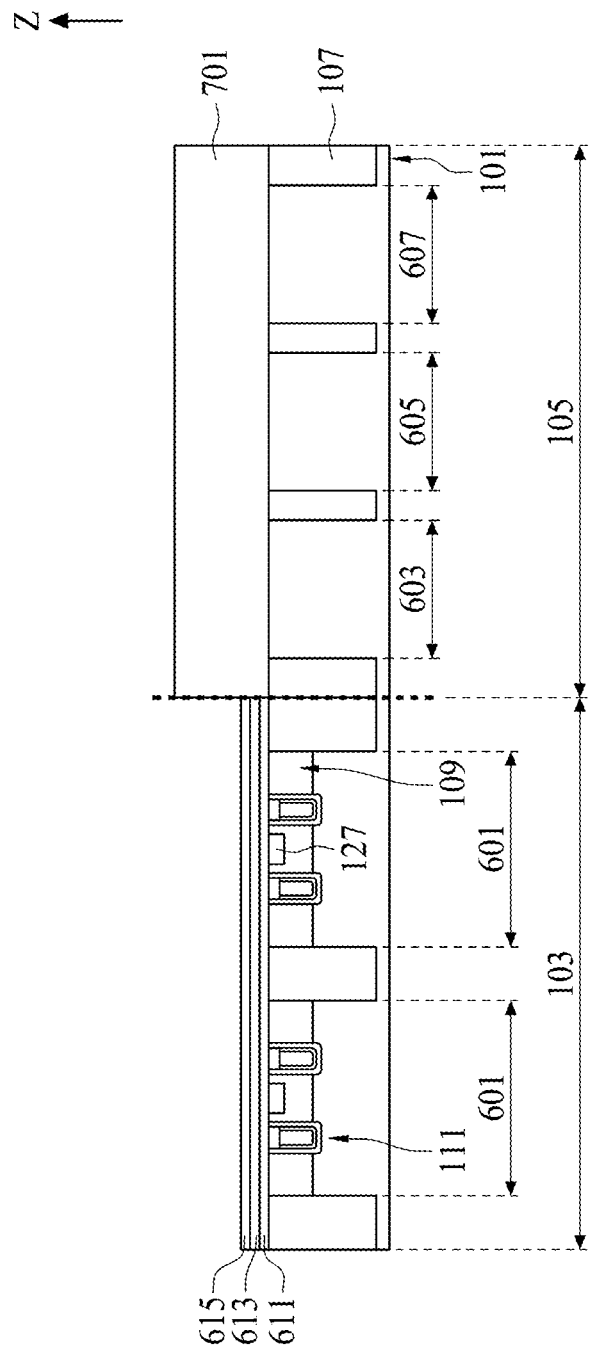

With reference to FIG. 15, a first mask layer 701 may be formed on the peripheral region 105 of the substrate 101. The first mask layer 701 may be formed of a photoresist or an anti-etch material. A series of deposition processes may be performed to sequentially deposit a bit line bottom electrode layer 611, a bit line top electrode layer 613, and a bit line mask layer 615 on the array region 103 of the substrate 101. The bit line bottom electrode layer 611 may be formed to cover the plurality of bit line contacts 127. The bit line top electrode layer 613 may be formed on the bit line bottom electrode layer 611. The bit line mask layer 615 may be formed on the bit line top electrode layer 613. The bit line bottom electrode layer 611 may be formed of doped polysilicon. The bit line top electrode layer 613 may be formed of a conductive material such as tungsten, aluminum, copper, nickel, or cobalt. The bit line mask layer 615 may be formed of silicon oxide, silicon nitride, silicon oxynitride, or silicon nitride oxide.

Figure 16:
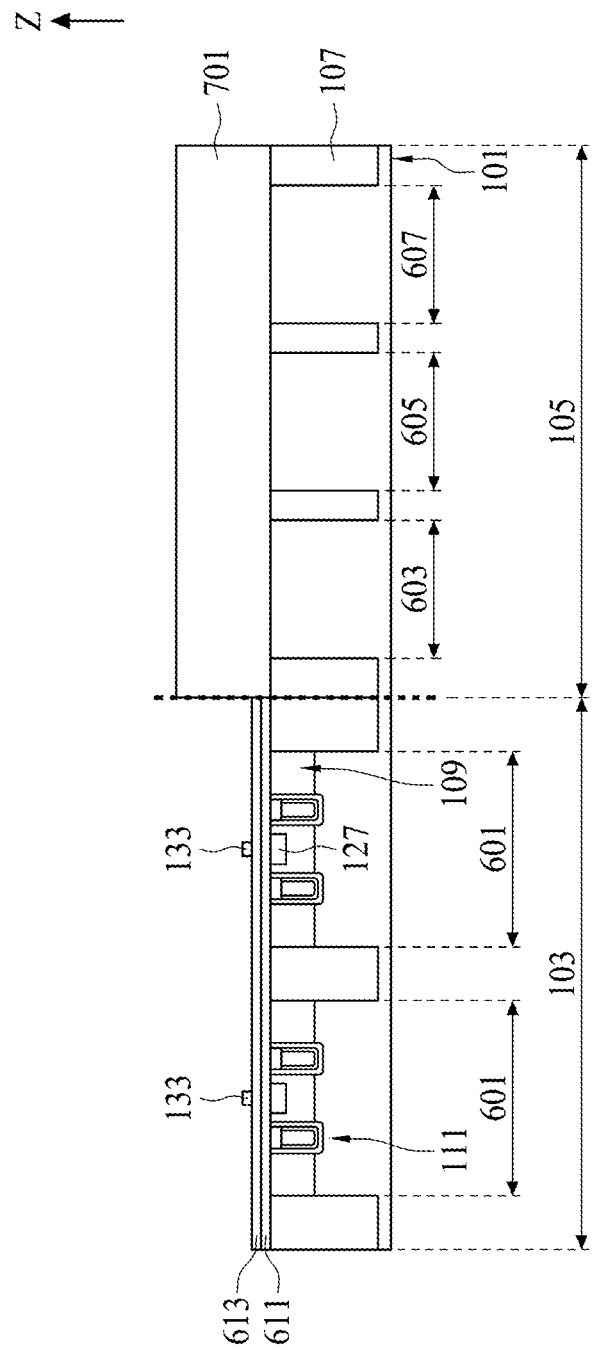
Figure 17:
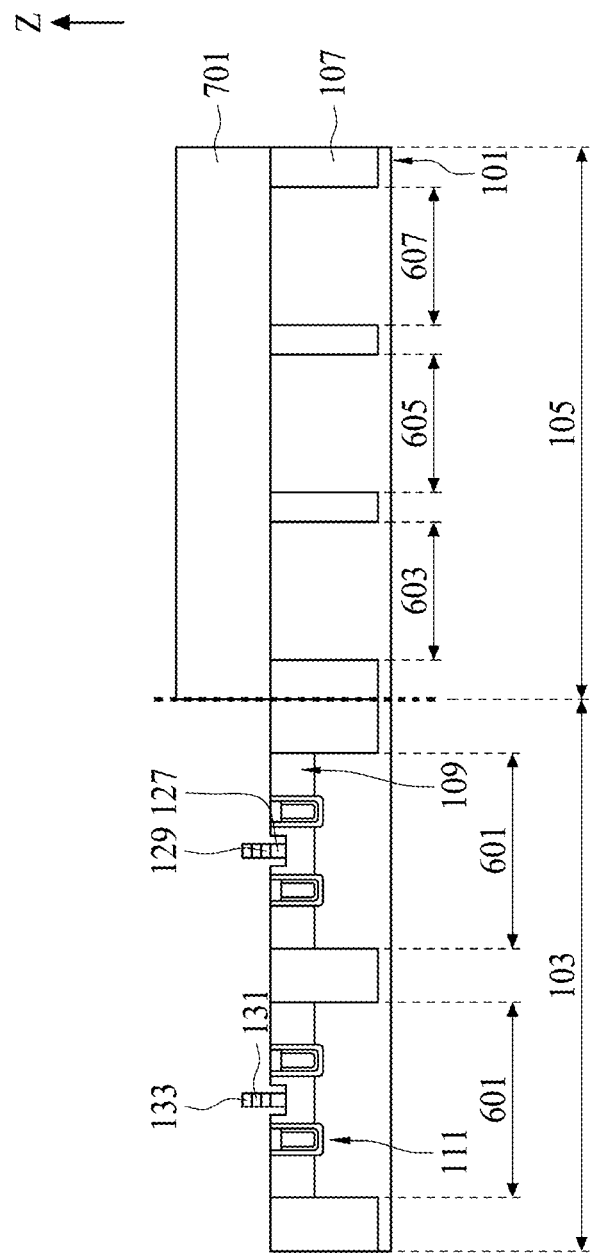

With reference to FIG. 16, a photolithography process may be performed to pattern the bit line mask layer 615 to define positions of the plurality of bit lines 123. An etch process may be performed after the photolithography process to pattern the bit line mask layer 615 into a plurality of bit line mask patterns 133. The plurality of bit line mask patterns 133 may protect the bit line top electrode layer 613 and the bit line bottom electrode layer 611 underneath the plurality of bit line mask patterns 133. With reference to FIG. 17, an etch process, such as an anisotropic dry etch process, may be performed with the plurality of bit line mask patterns 133 as masks. During the etch process, most of the bit line bottom electrode layer 611 and most of the bit line top electrode layer 613 may be removed, and only portions of the bit line bottom electrode layer 611 and the bit line top electrode layer 613 underneath the plurality of bit line mask patterns 133 may be retained and respectively correspondingly turned into a plurality of bit line bottom electrodes 129 and a plurality of bit line top electrodes 131. Portions of the plurality of bit line contacts 127 may be removed; in other words, widths of the plurality of bit line contacts 127 may be reduced. Hence, the plurality of bit line contacts 127 may be separated from an inner surface of the upper portion of the substrate 101.

Figure 18:
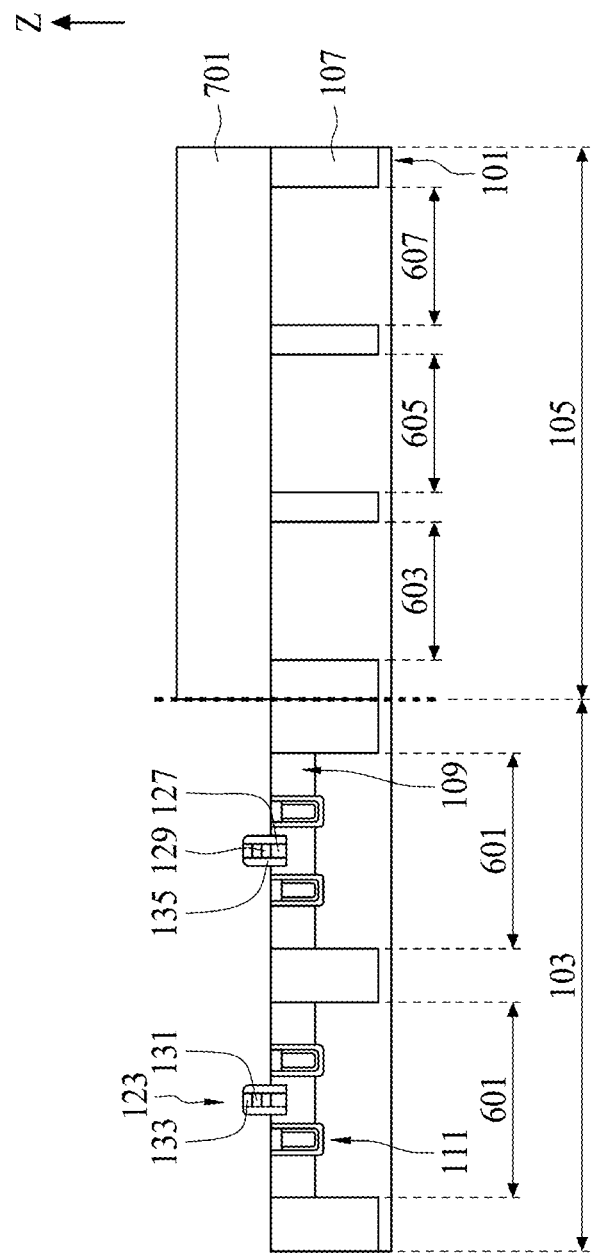

With reference to FIG. 18, a plurality of bit line spacers 135 may be respectively correspondingly formed to cover sidewalls of the plurality of bit line mask patterns 133, sidewalls of the plurality of bit line top electrodes 131, sidewalls of the plurality of bit line bottom electrodes 129, and the sidewalls of the plurality of bit line contacts 127. The plurality of bit line spacers 135 may fill spaces between the plurality of bit line contacts 127 and the inner surface of the upper portion of the substrate 101.

With reference to FIG. 5 and FIGS. 19 to 24, at step S21, a plurality of semiconductor elements may be formed on the peripheral region 105 of the substrate 101. Specifically, the plurality of semiconductor elements may be respectively correspondingly disposed on the second active region 603, the third active region 605, and the fourth active region 607 in the peripheral region 105 of the substrate 101. The plurality of semiconductor elements may include a first semiconductor element 201, a second semiconductor element 301, and a third semiconductor element 401.

Figure 19:
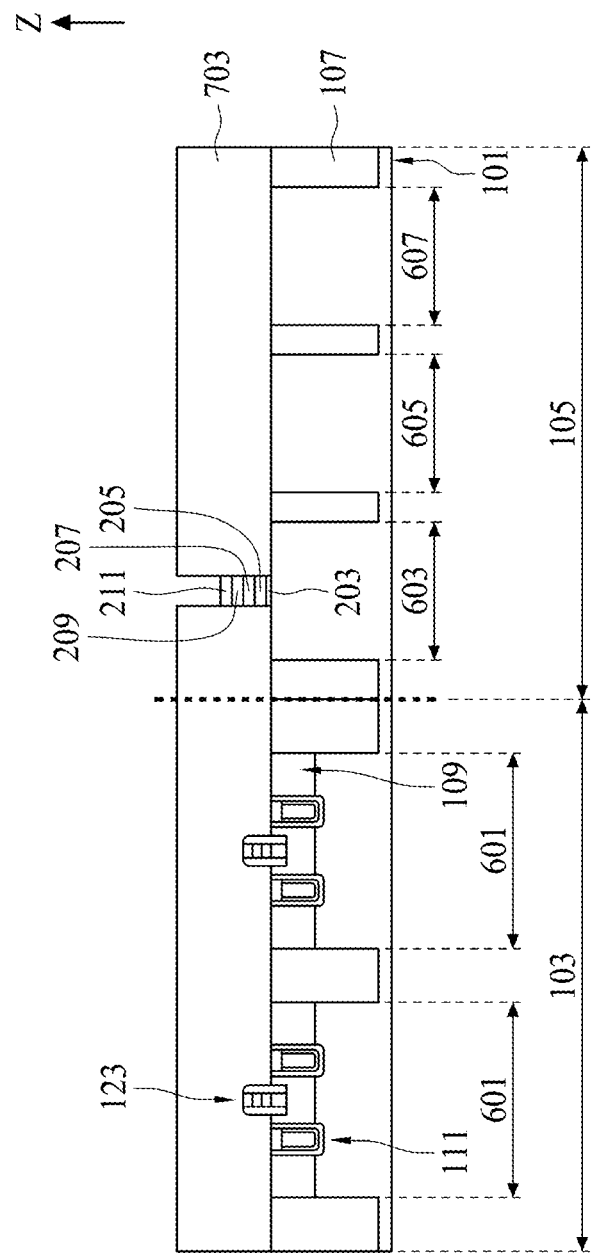

With reference to FIG. 19, the first mask layer 701 may be removed and a second mask layer 703 may be formed on the substrate 101. The second mask layer 703 may cover the array region 103 of the substrate 101 and the peripheral region 105 of the substrate while leaving a portion of a top surface of the second active region 603 uncovered. The second mask layer 703 may be formed of a photoresist. A series of deposition processes may be performed to sequentially deposit a first interfacial layer 203, a first insulating layer 205, a first bottom conductive layer 207, a first top conductive layer 209, and a first capping layer 211 on the second active region 603. Alternatively, the first interfacial layer 203 may be formed by an oxidation process. The first interfacial layer 203 may be formed on the portion of the top surface of the second active region 603. The first interfacial layer 203 may be formed of silicon oxide. A thickness of the first interfacial layer 203 may be no greater than 2.0 nm. Preferably, the thickness of the first interfacial layer 203 may be no greater than 0.5 nm. The first insulating layer 205 may be formed above the first interfacial layer 203. Specifically, the first insulating layer 205 may be formed on the first interfacial layer 203. The first bottom conductive layer 207 may be formed above the first insulating layer 205. Specifically, the first bottom conductive layer 207 may be formed on the first insulating layer 205.

With reference to FIG. 19, the first top conductive layer 209 may be formed above the first bottom conductive layer 207. Specifically, the first top conductive layer 209 may be formed on the first bottom conductive layer 207. The first top conductive layer 209 may be formed of tungsten or cobalt. The first capping layer 211 may be formed above the first top conductive layer 209. Specifically, the first capping layer 211 may be formed on the first top conductive layer 209. Alternatively, in another embodiment, a first dipole layer 219 (not shown) may be formed between the first interfacial layer 203 and the first insulating layer 205. A thickness of the first dipole layer 219 may be between about 0.1 nm and about 1.0 nm. In addition, an anneal process may be performed after the series of deposition processes to homogenize the first insulating layer 205 and the first dipole layer 219 at an interface between the first insulating layer 205 and the first dipole layer 219 to aid in controlling a first threshold voltage of the first semiconductor element 201. A temperature of the anneal process may be between about 200° C. and about 800° C.

Figure 20:
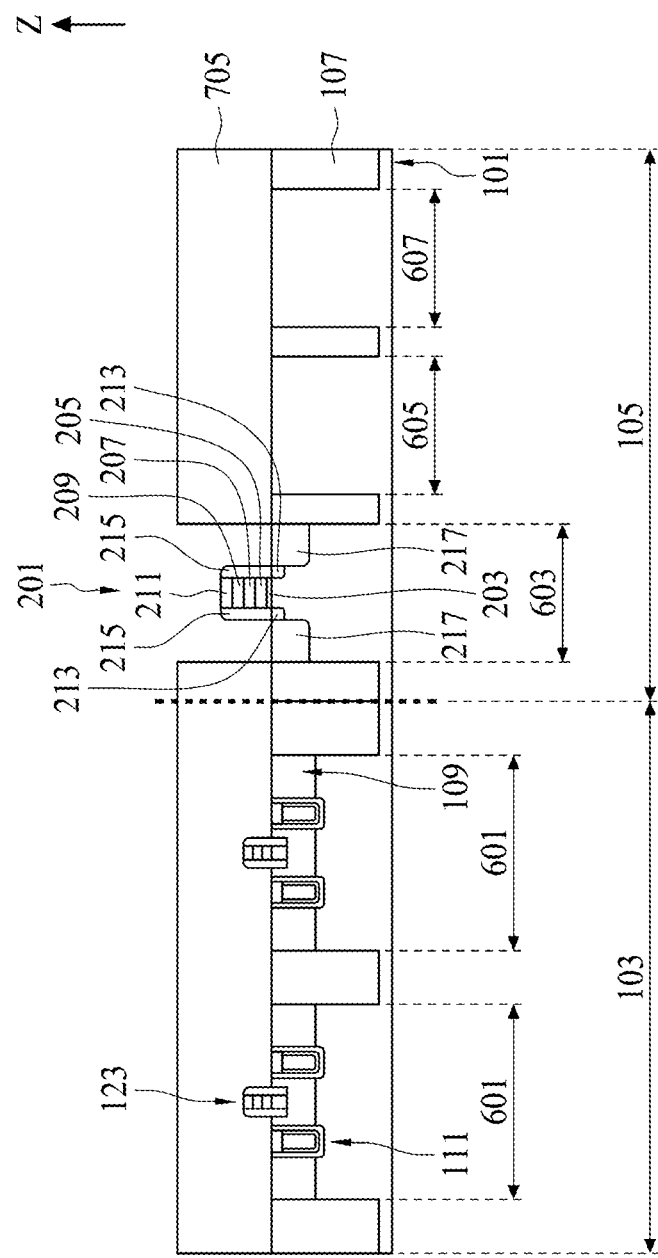
Figure 21:
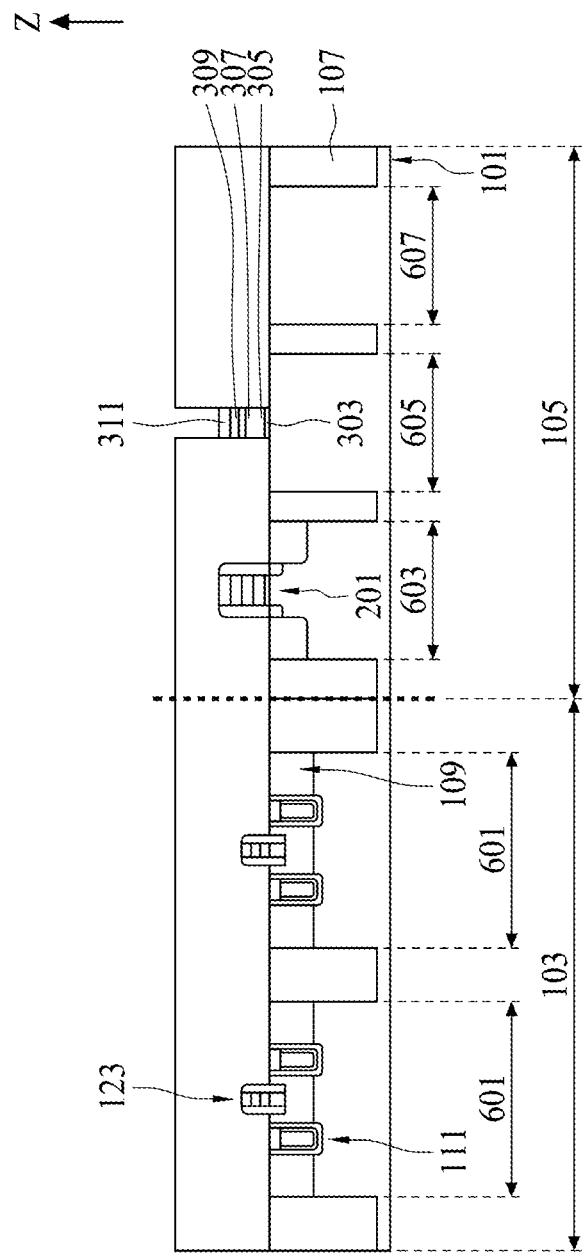
Figure 22:
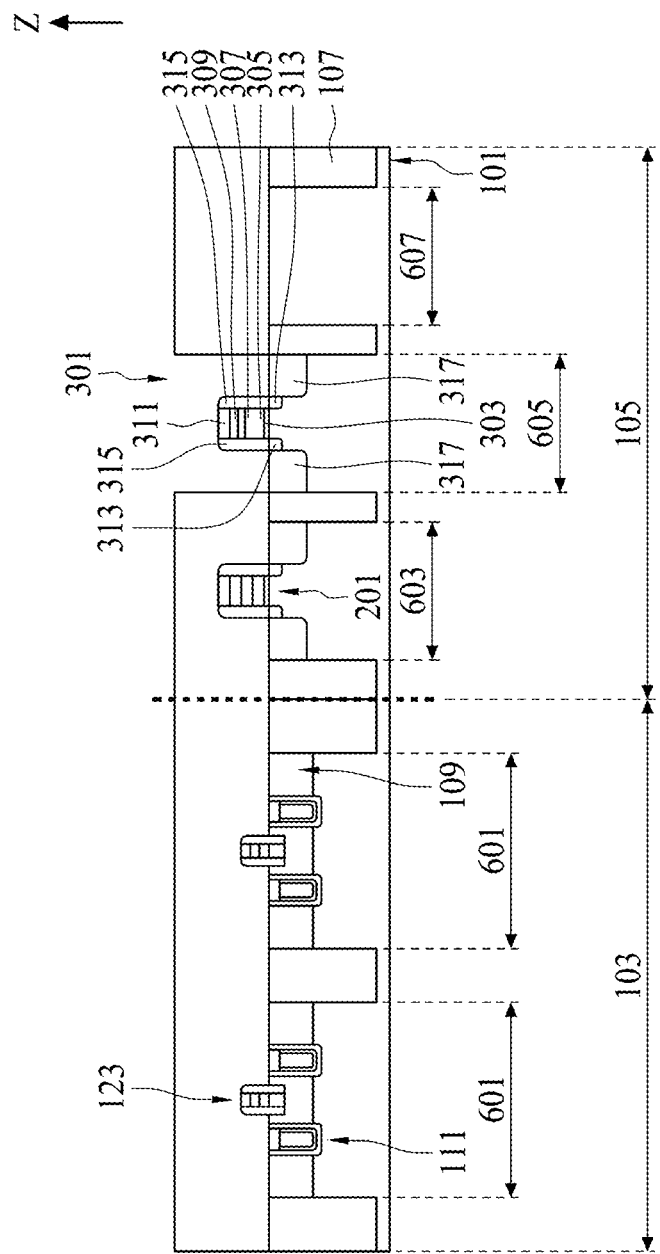
Figure 23:
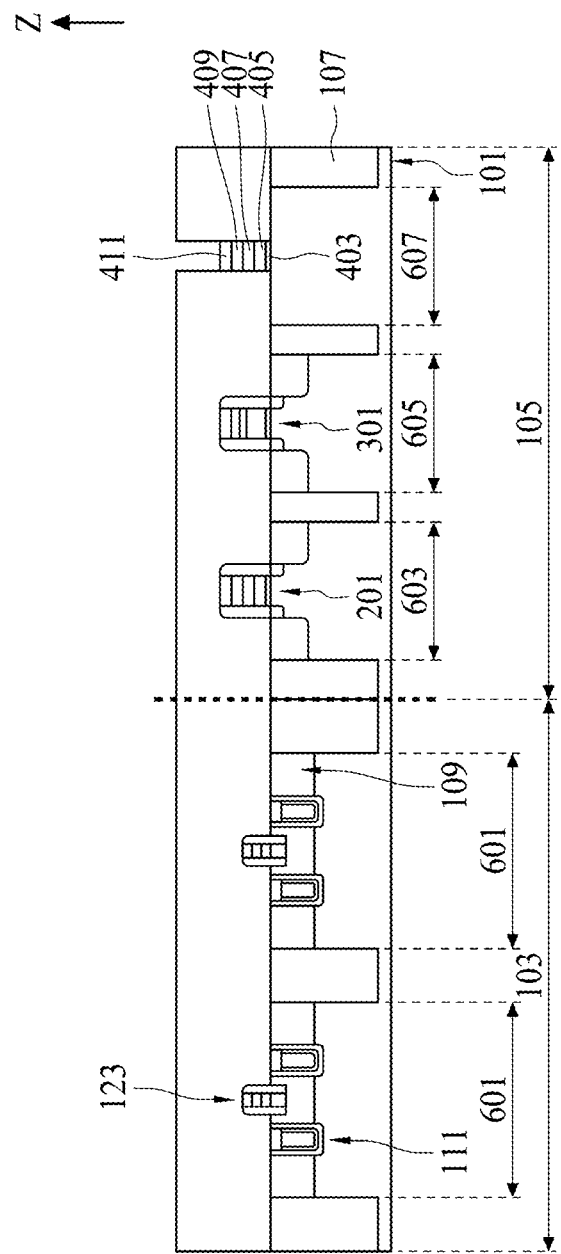
Figure 24:
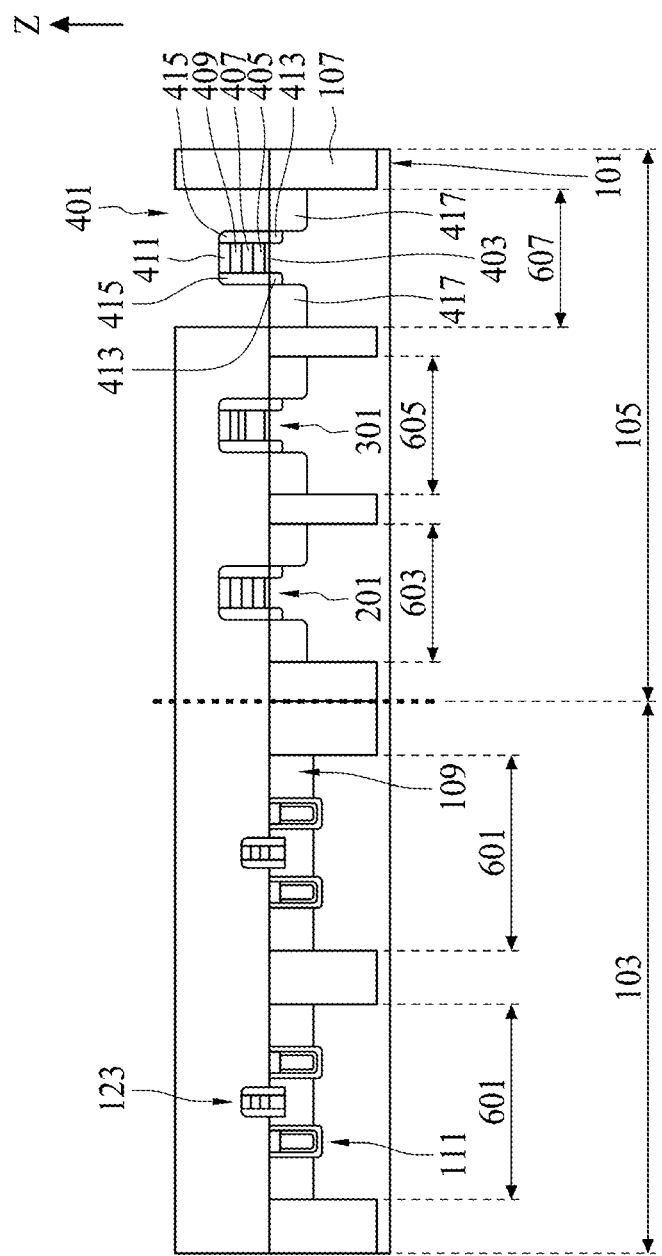

With reference to FIG. 20, the second mask layer 703 may be removed and a third mask layer 705 may be formed on the substrate 101. The third mask layer 705 may cover the array region 103 of the substrate 101 and the peripheral region 105 of the substrate while not covering the top surface of the second active region 603. The third mask layer 705 may be formed of a photoresist. An implantation process may be performed to form a plurality of first lightly doped regions 213. The plurality of first lightly doped regions 213 may be doped with a dopant such as phosphorus, arsenic, or antimony. A plurality of first spacers 215 may be formed over sidewalls of the first capping layer 211, sidewalls of the first top conductive layer 209, sidewalls of the first bottom conductive layer 207, sidewalls of the first insulating layer 205, and sidewalls of the first interfacial layer 203.

With reference to FIG. 20, an implantation process may be performed to form a plurality of first doped regions 217. The plurality of first doped regions 217 may be doped with a dopant such as phosphorus, arsenic, or antimony. The first interfacial layer 203, the first insulating layer 205, the first bottom conductive layer 207, the first top conductive layer 209, the first capping layer 211, the plurality of first lightly doped regions 213, the plurality of first spacers 215, and the plurality of first doped regions 217 together form the first semiconductor element 201. The first semiconductor element 201 may have the first threshold voltage. A value of the first threshold voltage may be determined by the thickness or material of the first insulating layer 205, the first bottom conductive layer 207, and the first top conductive layer 209 of the first semiconductor element 201. Alternatively, in another embodiment, the value of the first threshold voltage may be further determined by the first dipole layer 219 and the anneal process.

With reference to FIGS. 21 to 24, the second semiconductor element 301 and the third semiconductor element 401 may be formed, by processes similar to that used to form the first semiconductor element 201, on the third active region 605 and the fourth active region 607, respectively. The second semiconductor element 301 may have a second threshold voltage different from the first threshold voltage of the first semiconductor element 201. The second semiconductor element 301 may include a second interfacial layer 303, a second insulating layer 305, a second bottom conductive layer 307, a second top conductive layer 309, a second capping layer 311, a plurality of second lightly doped regions 313, and plurality of second spacers 315. The third semiconductor element 401 has a third threshold voltage different from the first threshold voltage of the first semiconductor element 201. The third semiconductor element 401 may include a third interfacial layer 403, a third insulating layer 405, a third bottom conductive layer 407, a third top conductive layer 409, a third capping layer 411, and a plurality of third spacers 415.

With reference to FIG. 5 and FIGS. 25 to 37, at step S23, a plurality of capacitor structures 137 may be formed above the array region 103 of the substrate 101 and a plurality of conductive interconnections may be formed above the substrate 101. The plurality of capacitor structures 137 may include a plurality of capacitor bottom electrodes 141, a capacitor insulating layer 143, and a capacitor top electrode 145. The plurality of conductive interconnections may include a plurality of first conductive plugs 515, a plurality of landing pads 517, a second conductive plug 519, a plurality of third conductive plugs 521, a plurality of first conductive layers 523, a plurality of fourth conductive plugs 525, and a plurality of second conductive layers 527.

Figure 25:
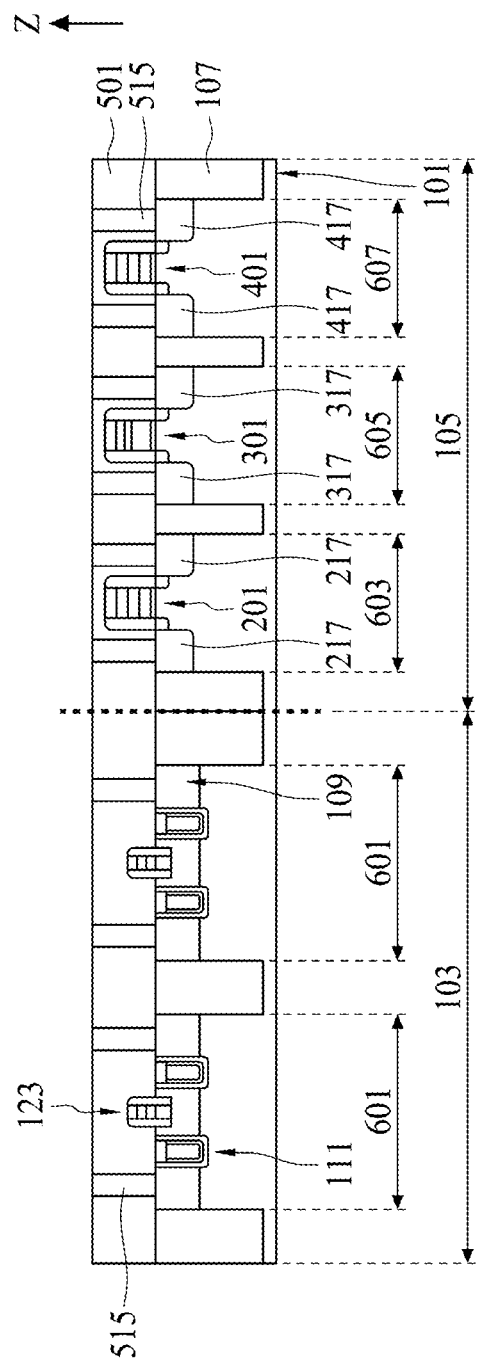
Figure 26:
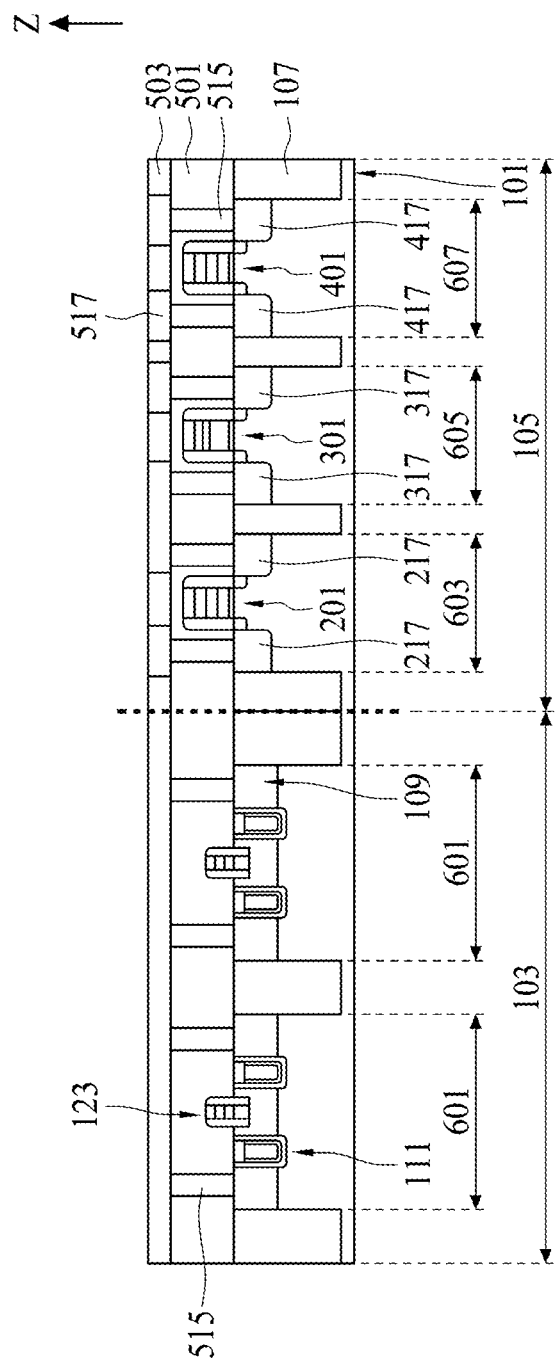
Figure 27:
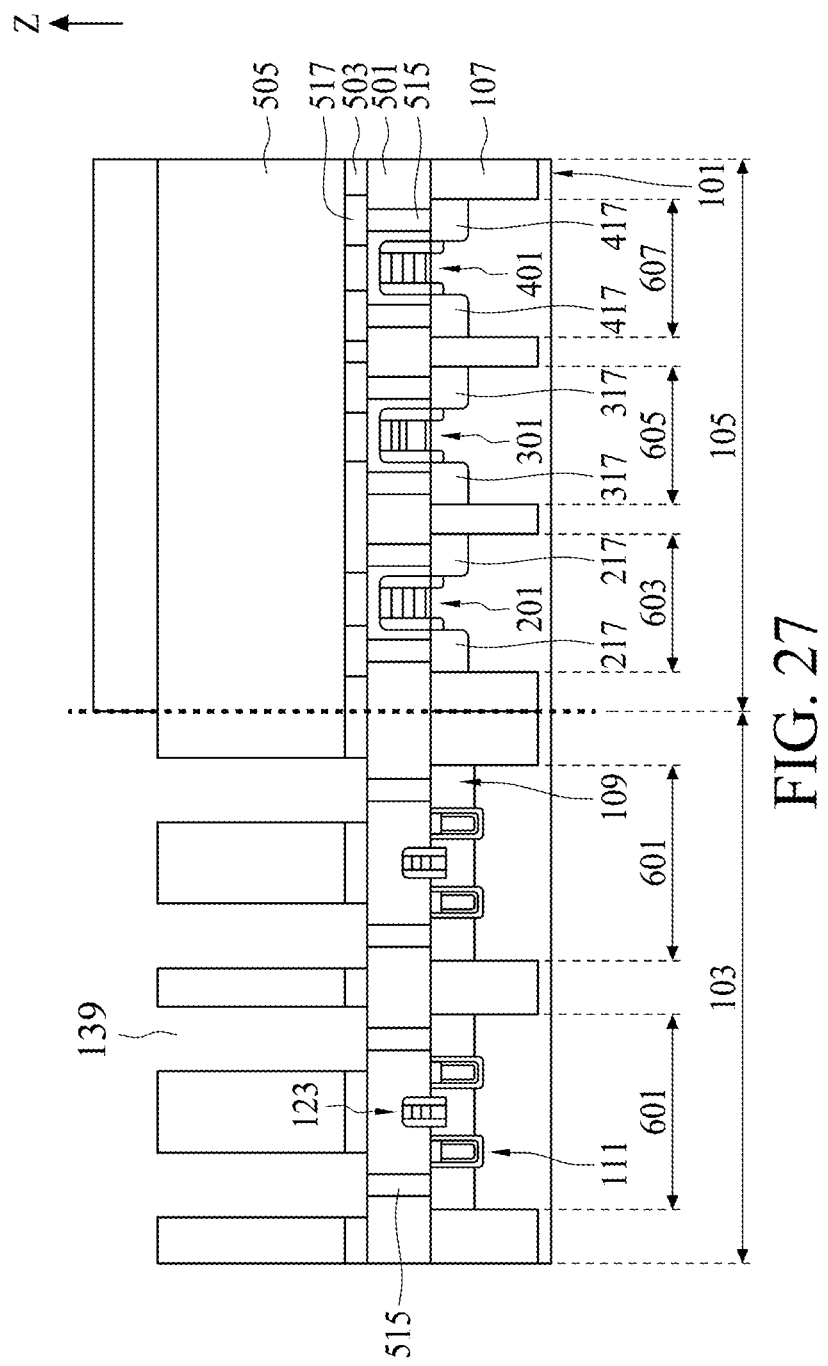

With reference to FIG. 25, a first insulating film 501 may be formed over the array region 103 of the substrate 101 and the first semiconductor element 201, the second semiconductor element 301, and the third semiconductor element 401. The plurality of first conductive plugs 515 may be formed in the first insulating film 501 and respectively correspondingly electrically connected to the plurality of array doped regions 109, the plurality of first doped regions 217, the plurality of second doped regions 317, and the plurality of third doped regions 417. With reference to FIG. 26, a second insulating film 503 may be formed over the array region 103 of the substrate 101 and the peripheral region 105 of the substrate 101. The plurality of landing pads 517 may be formed in the second insulating film 503 and respectively correspondingly electrically connected to the plurality of first conductive plugs 515 of the peripheral region 105. With reference to FIG. 27, a third insulating film 505 may be formed over the array region 103 of the substrate 101 and the peripheral region 105 of the substrate 101. A photolithography process may be performed to pattern the third insulating film 505 to define positions of the plurality of capacitor structures 137 and mask the peripheral region 105 of the substrate 101. An etch process may be performed after the photolithography process to form a plurality of capacitor trenches 139 penetrating through the third insulating film 505 and the second insulating film 503. The plurality of first conductive plugs 515 of the array region 103 may be exposed by the plurality of capacitor trenches 139.

Figure 28:
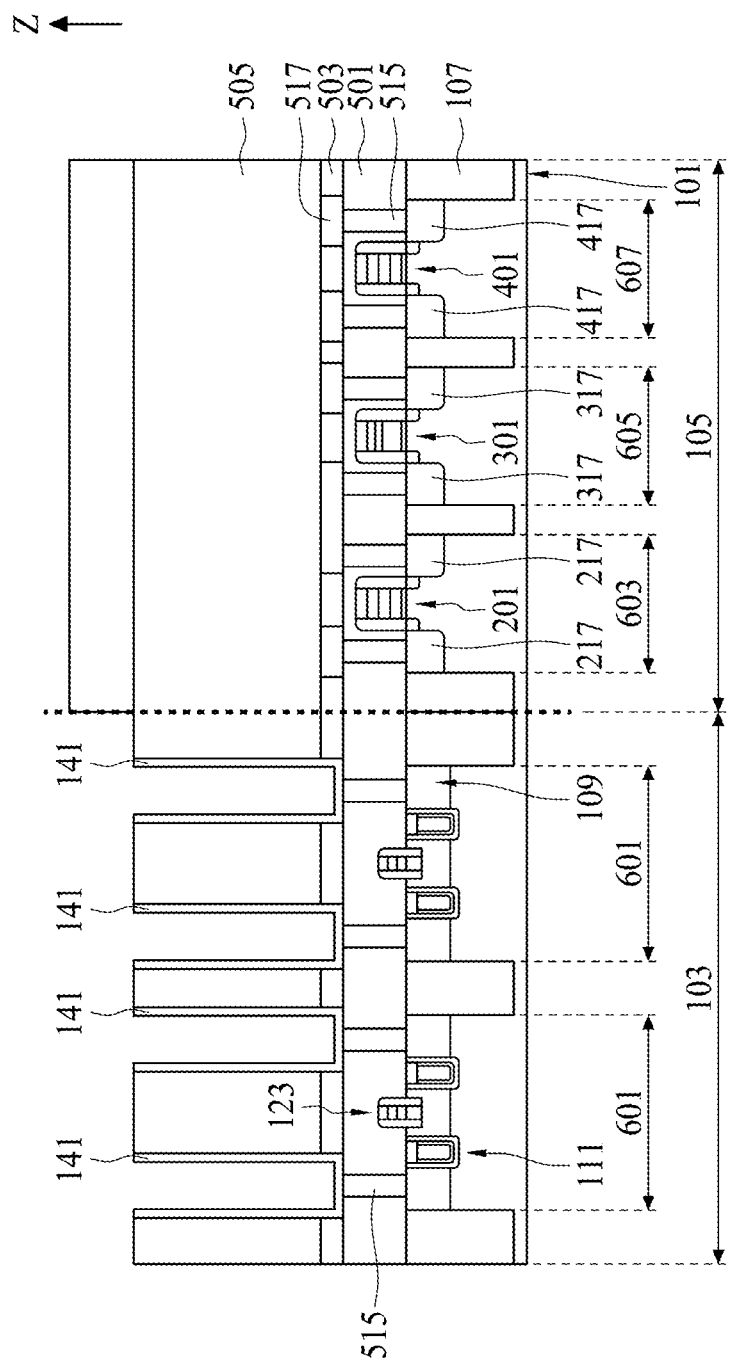
Figure 29:
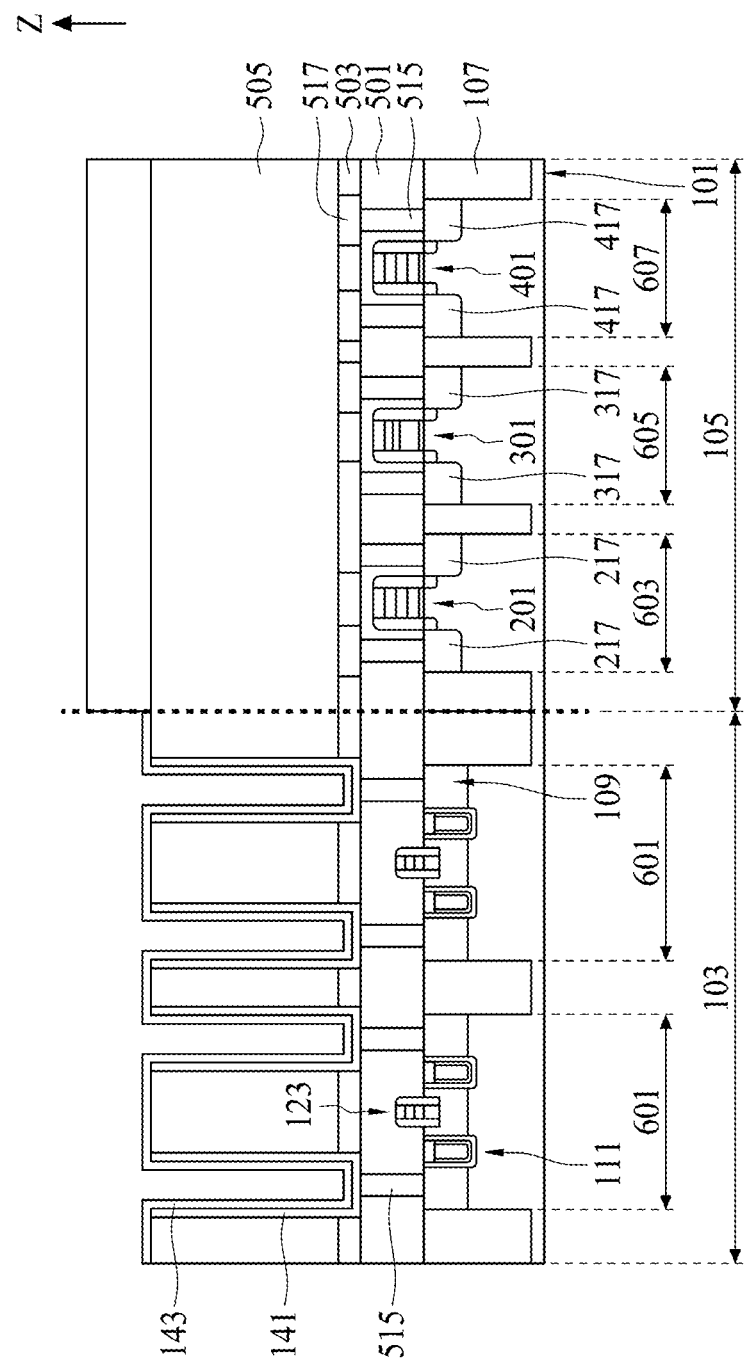
Figure 30:
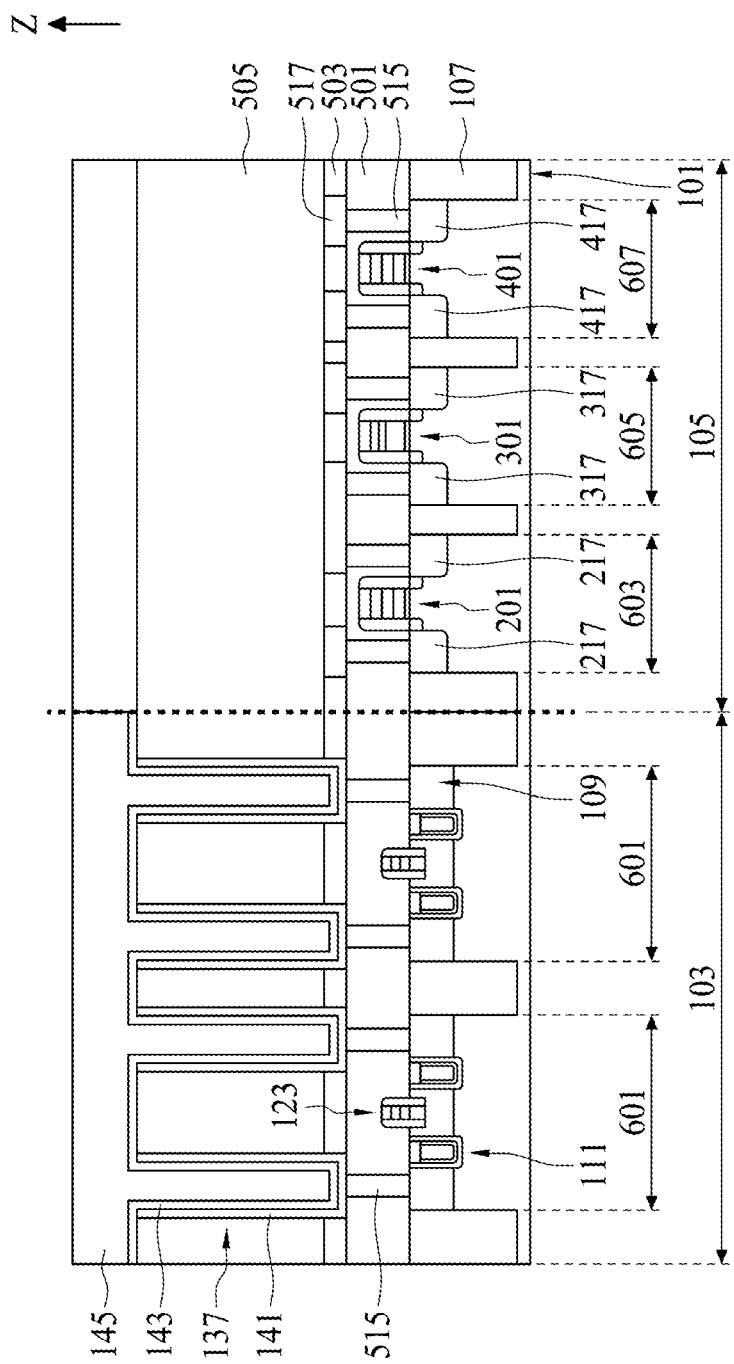
Figure 31:
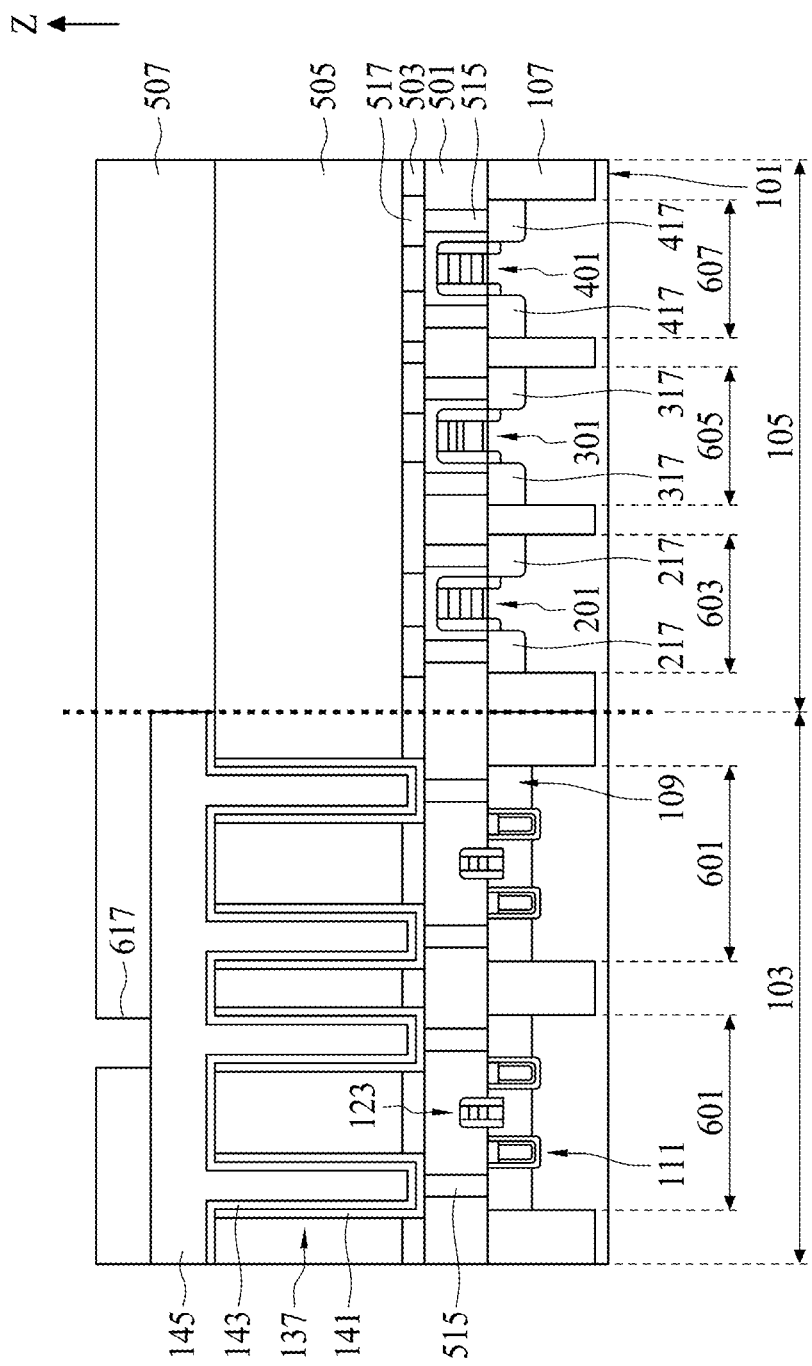

With reference to FIG. 28, the plurality of capacitor bottom electrodes 141 may be formed in the plurality of capacitor trenches 139. The plurality of capacitor bottom electrodes 141 may be formed of doped polysilicon, metal, or metal silicide. The plurality of capacitor bottom electrodes 141 may be respectively correspondingly electrically connected to the plurality of first conductive plugs 515 of the array region 103. With reference to FIG. 29, the capacitor insulating layer 143 may be formed on the plurality of capacitor bottom electrodes 141. The capacitor insulating layer 143 may be formed of a single layer including an insulating material having a dielectric constant of about 4.0 or greater. With reference to FIG. 30, the capacitor top electrode 145 may be formed on the capacitor insulating layer 143 by a deposition process. The capacitor top electrode 145 may be formed of doped polysilicon or metal. A planarization process may be performed to provide a substantially flat surface for subsequent processing steps. A cleaning process may be performed to remove a mask on the peripheral region 105 of the substrate 101. With reference to FIG. 31, a fourth insulating film 507 may be formed over the array region 103 of the substrate 101 and the peripheral region 105 of the substrate 101. A photolithography process may be performed to pattern the fourth insulating film 507 to define a position of the second conductive plug 519. An etch process may be performed after the photolithography process to form a second conductive plug opening 617 in the fourth insulating film 507.

Figure 32:
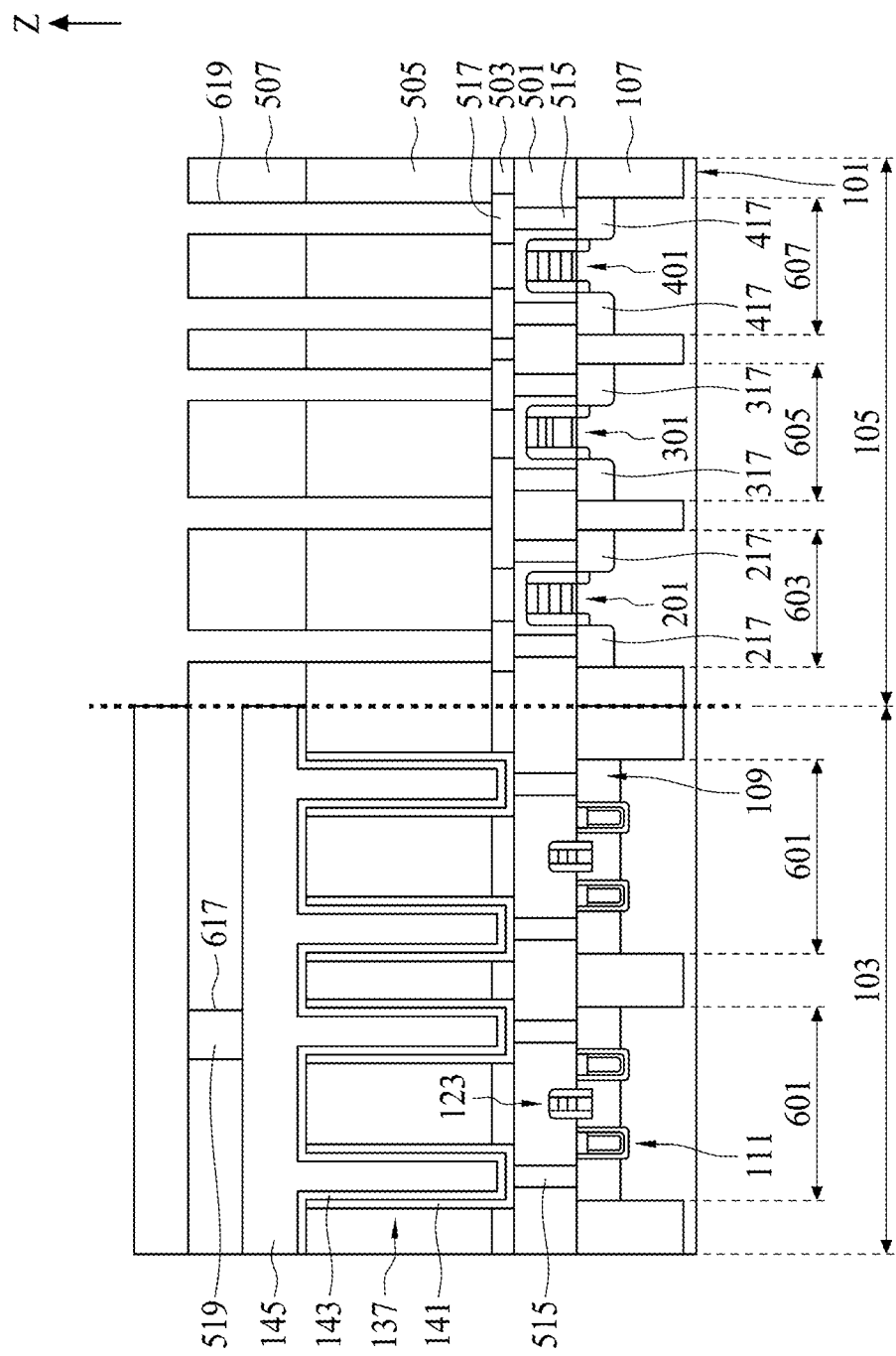

With reference to FIG. 32, after the etch process, a conductive material may be used to fill the second conductive plug opening 617 and a planarization process may be performed to remove excess filling material, provide a substantially flat surface for subsequent processing steps, and conformally form the second conductive plug 519. The second conductive plug 519 may be respectively correspondingly electrically connected to the capacitor top electrode 145. A photolithography process may be performed to pattern the fourth insulating film 507 to define positions of the plurality of third conductive plugs 521 and mask the array region 103 of the substrate 101. An etch process may be performed after the photolithography process to form a plurality of third conductive plug openings 619 penetrating through the fourth insulating film 507 and the third insulating film 505.

Figure 33:
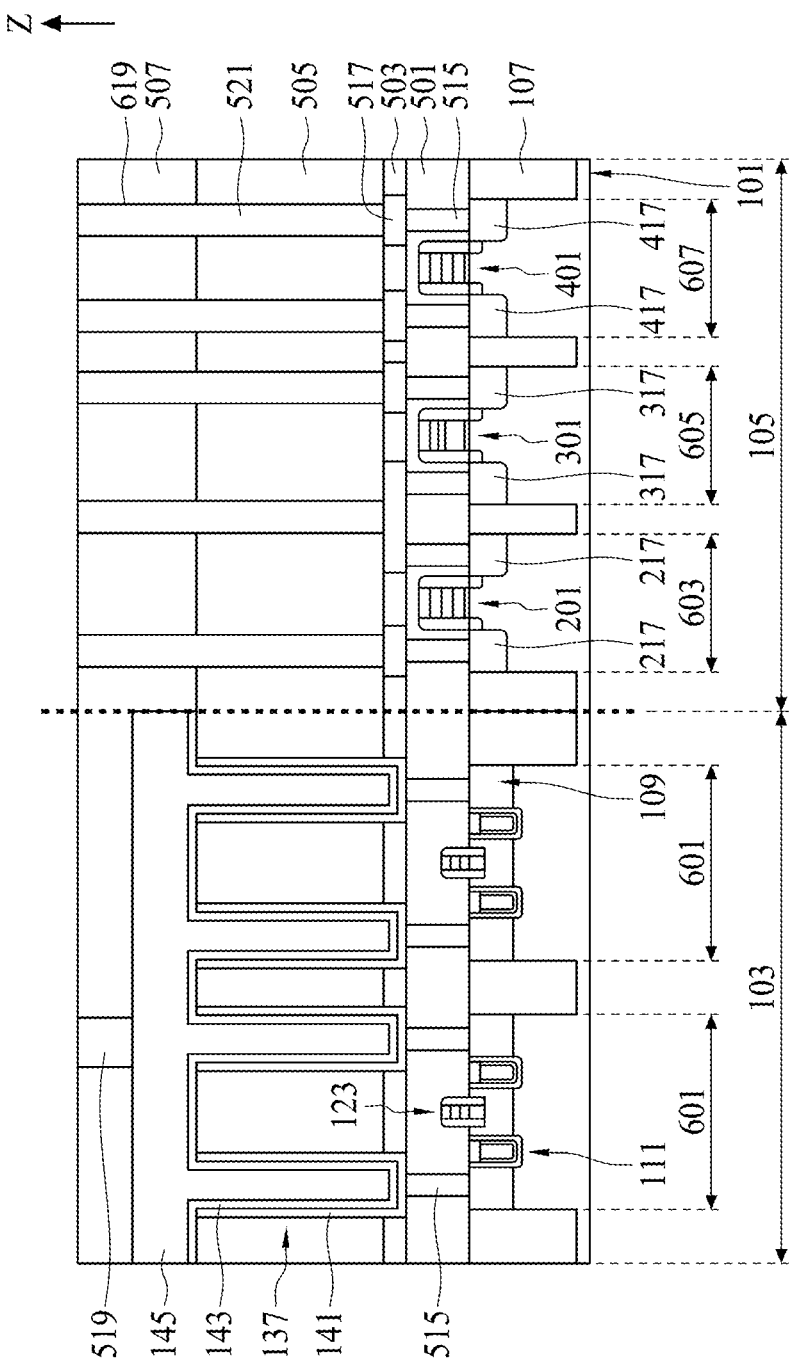
Figure 34:
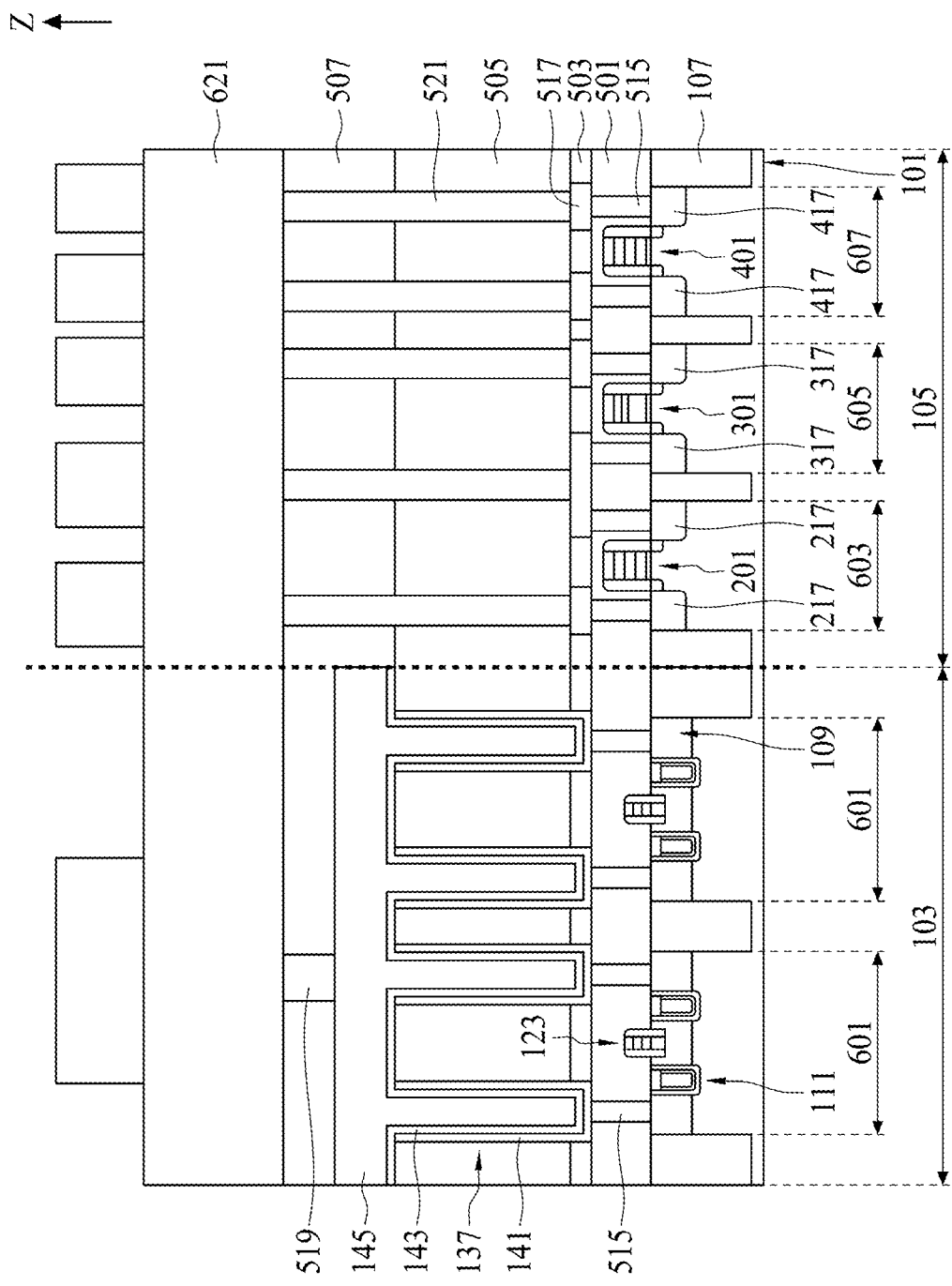

With reference to FIG. 33, a conductive material may be used to fill the plurality of third conductive plug openings 619. A cleaning process may be performed to remove a mask on the array region 103 of the substrate 101. After the cleaning process, a planarization process may be performed to remove excess filling material, provide a substantially flat surface for subsequent processing steps, and conformally form the plurality of third conductive plugs 521. With reference to FIG. 34, a conductive film 621 may be formed over the array region 103 of the substrate 101 and the peripheral region 105 of the substrate 101. A photolithography process may be performed to pattern the conductive film 621 to define positions of the plurality of first conductive layers 523.

Figure 35:
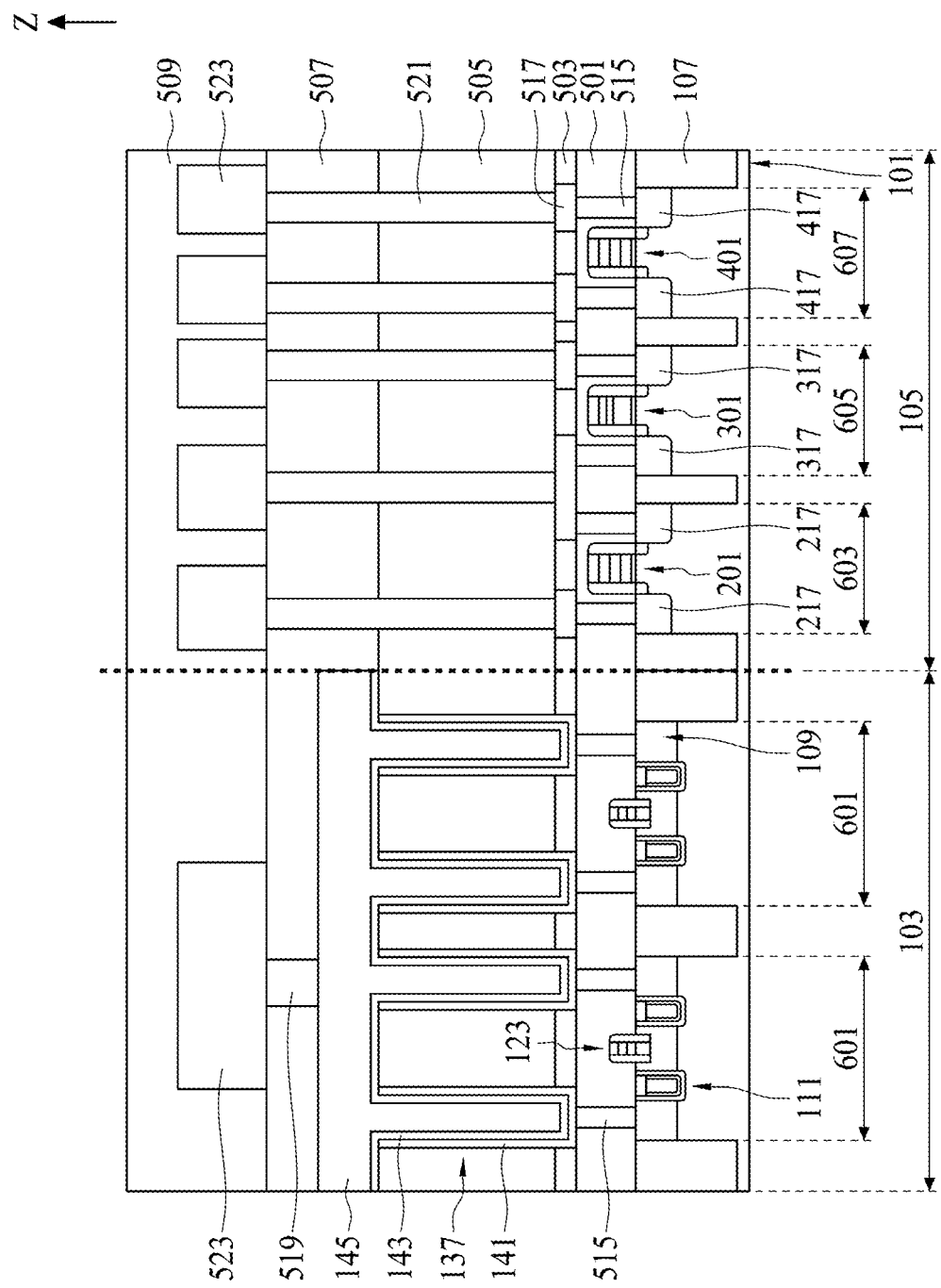
Figure 36:
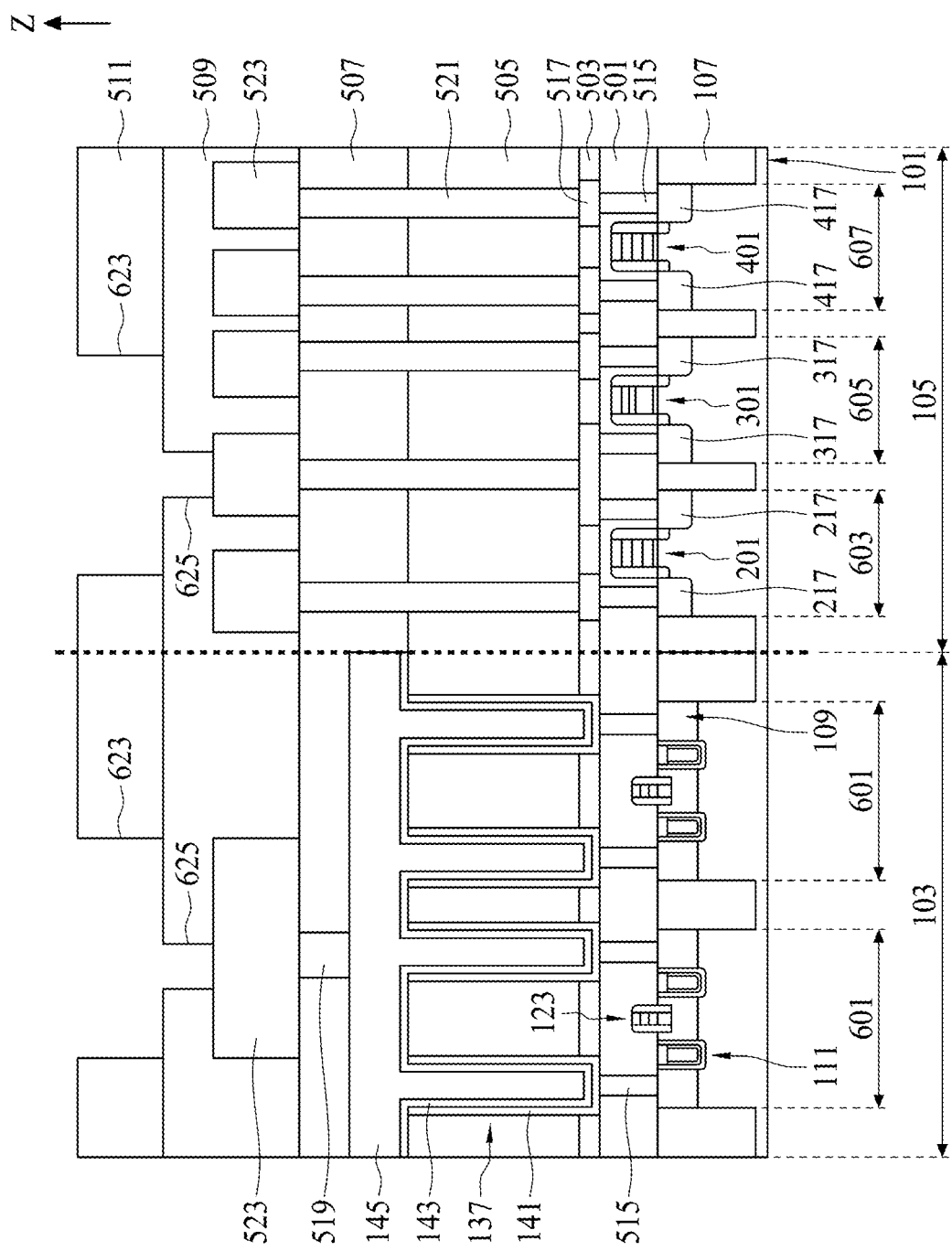

With reference to FIG. 35, an etch process may be performed after the photolithography process to form the plurality of first conductive layers 523. A fifth insulating film 509 may be formed over the array region 103 of the substrate 101 and the peripheral region 105 of the substrate 101. A planarization process may be performed to provide a substantially flat surface for subsequent processing steps. With reference to FIG. 36, a sixth insulating film 511 may be formed over the array region 103 of the substrate 101 and the peripheral region 105 of the substrate 101. A first photolithography process may be performed to pattern the sixth insulating film 511 to define positions of the plurality of second conductive layers 527. A first etch process may be performed after the first photolithography process to form a plurality of second conductive layer trenches 623 in the sixth insulating film 511. A second photolithography process may be performed to pattern the fifth insulating film 509 to define positions of the plurality of fourth conductive plugs 525. A second etch process may be performed after the second photolithography process to form a plurality of fourth conductive plug openings 625 in the fifth insulating film 509.

Figure 37:
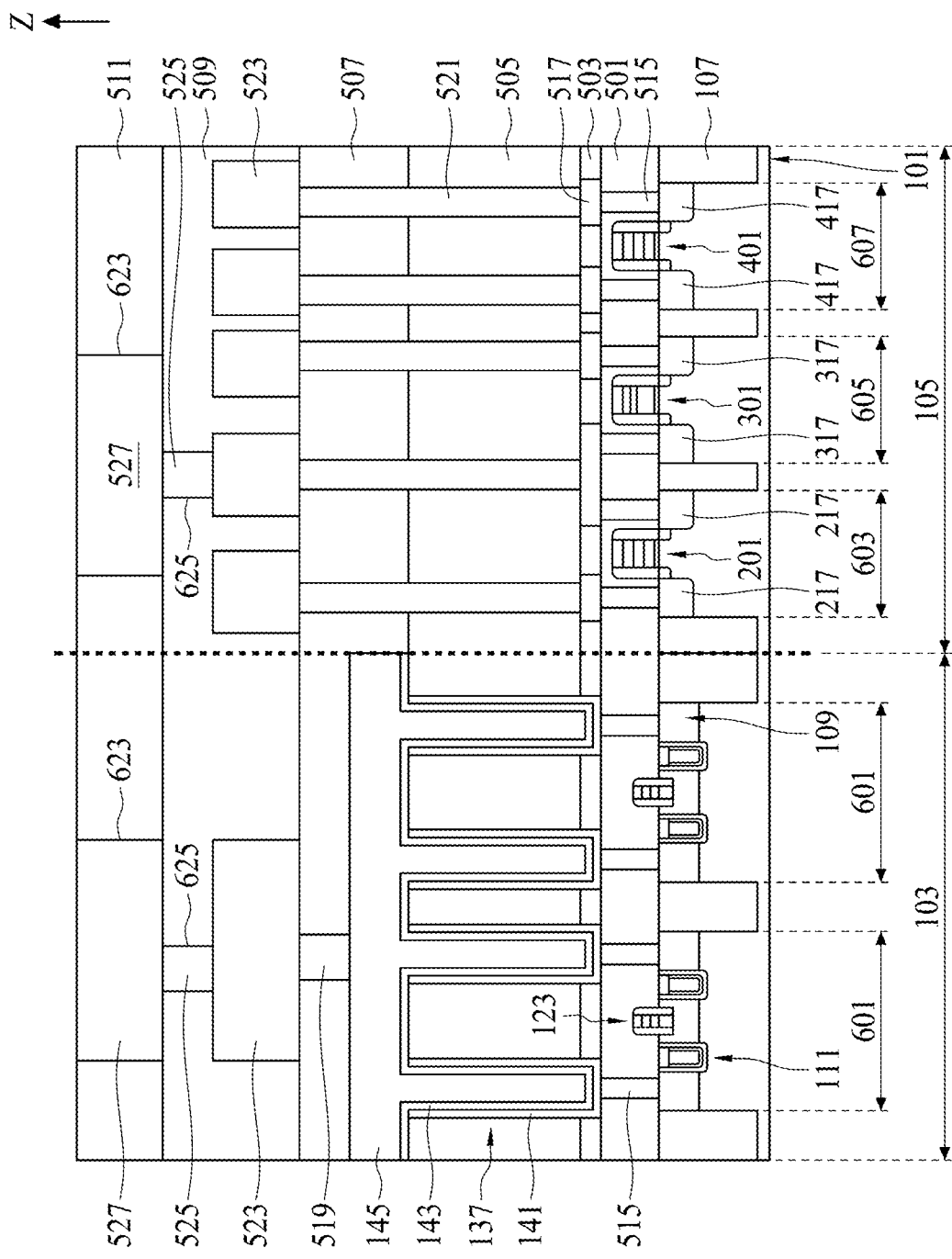

With reference to FIG. 37, a conductive material such as aluminum, copper, tungsten, cobalt, or other suitable metal or metal alloy may be used to fill the plurality of second conductive layer trenches 623 and the plurality of fourth conductive plug openings 625. A planarization process may be performed to remove excess filling material, provide a substantially flat surface for subsequent processing steps, and conformally form the plurality of fourth conductive plugs 525 and the plurality of second conductive layers 527.

Figure 38:
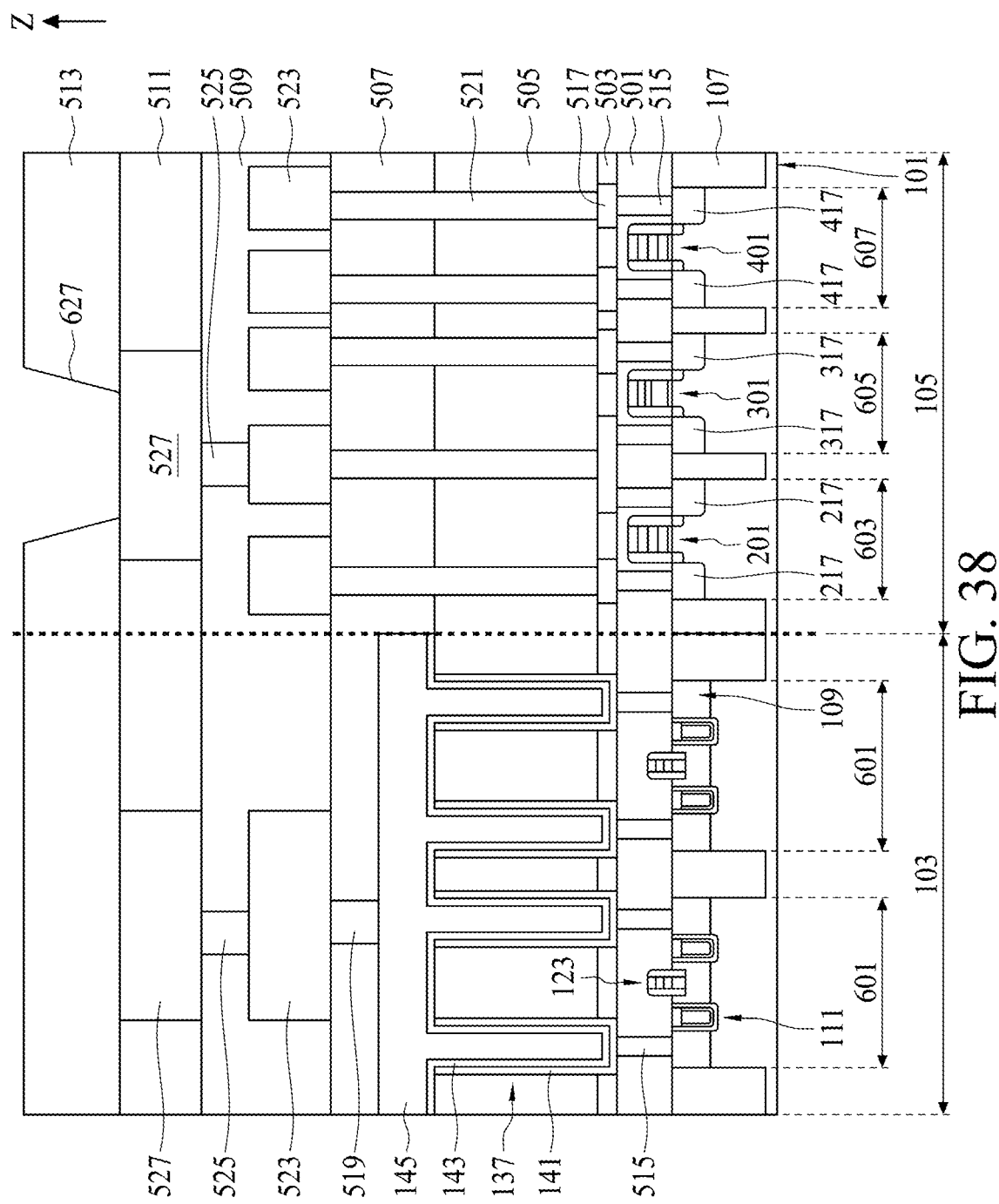

With reference to FIGS. 1, 5 and 38, at step S25, a solder unit 801 may be formed above the peripheral region 105 of the substrate 101. With reference to FIG. 38, a seventh insulating film 513 may be formed over the array region 103 of the substrate 101 and the peripheral region 105 of the substrate 101. A photolithography process may be performed to pattern the seventh insulating film 513 to define a position of the solder unit 801. An etch process may be performed after the photolithography process to form a solder unit opening 627 in the seventh insulating film 513. With reference back to FIG. 1, the solder unit 801 may be formed in the solder unit opening 627. Specifically, a lower portion of the solder unit 801 may be disposed in the seventh insulating film 513 and an upper portion of the solder unit 801 may be disposed on the seventh insulating film 513. The solder unit 801 may be disposed on the plurality of second conductive layers 527 and respectively correspondingly electrically connected to the plurality of second conductive layers 527.

Due to the design of the semiconductor device of the present disclosure, the first threshold voltage of the first semiconductor element 201, the second threshold voltage of the second semiconductor element 301, and the third threshold voltage of the third semiconductor element 401 are different from each other and the multiple threshold voltage property of the semiconductor device may broaden the applicability of the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
 a substrate comprising an array region and a peripheral region surrounding the array region;
 a plurality of capacitor structures positioned above the array region of the substrate, wherein the plurality of capacitor structures comprise a plurality of capacitor bottom electrodes inwardly positioned in an insulating film above the array region of the substrate, a capacitor insulating layer inwardly positioned in the plurality of capacitor bottom electrodes, and a capacitor top electrode inwardly positioned in the capacitor insulating layer;
 a plurality of bit lines positioned in the array region of the substrate, wherein the plurality of bit lines comprise a plurality of bit line contacts positioned in an upper portion of the array region of the substrate, and top surfaces of the plurality of bit line contacts is at the same vertical level as the top surface of the substrate;
 a first semiconductor element positioned above the peripheral region and having a first threshold voltage; and
 a second semiconductor element positioned above the peripheral region and having a second threshold voltage;
 wherein the first threshold voltage of the first semiconductor element is different from the second threshold voltage of the second semiconductor element.

2. The semiconductor device of claim 1, wherein the first semiconductor element comprises a first insulating layer and a first bottom conductive layer positioned above the first insulating layer, the second semiconductor element comprises a second insulating layer and a second bottom conductive layer positioned above the second insulating layer, a thickness of the first insulating layer is between about 0.1 nm and about 2.0 nm, and a thickness of the second insulating layer is between about 0.1 nm and about 2.0 nm.

3. The semiconductor device of claim 2, wherein a thickness of the first bottom conductive layer is between about 1.0 nm and about 3.0 nm, and a thickness of the second bottom conductive layer is between about 1.0 nm and about 3.0 nm.

4. The semiconductor device of claim 3, wherein the first semiconductor element further comprises a first dipole layer positioned below the first insulating layer, the second semiconductor element further comprises a second dipole layer positioned below the second insulating layer, a thickness of the first dipole layer is between about 0.1 nm and about 1.0 nm, and a thickness of the second dipole layer is between about 0.1 nm and about 1.0 nm.

5. The semiconductor device of claim 4, wherein the first semiconductor element further comprises a plurality of first spacers, the plurality of first spacers cover sidewalls of the first insulating layer, sidewalls of the first bottom conductive layer, and sidewalls of the first dipole layer, and the plurality of first spacers are formed of an insulating material having a dielectric constant of about 4.0 or greater.

6. The semiconductor device of claim 1, further comprising an isolation layer positioned in the substrate, wherein the isolation layer is formed of silicon oxide, silicon nitride, silicon oxynitride, or silicon nitride oxide.

7. The semiconductor device of claim 1, wherein the plurality of bit lines comprise a plurality of bit line bottom electrodes positioned above the plurality of bit line contacts, a plurality of bit line top electrodes positioned above the plurality of bit line bottom electrodes, a plurality of bit line mask patterns positioned above the plurality of bit line top electrodes, and a plurality of bit line spacers covering sidewalls of the plurality of bit line contacts, sidewalls of the plurality of bit line bottom electrodes, sidewalls of the plurality of bit line top electrodes, and sidewalls of the plurality of bit line mask patterns.

8. The semiconductor device of claim 1, further comprising a plurality of word line insulating layers inwardly positioned in the array region of the substrate, a plurality of word line barrier layers positioned on the plurality of word line insulating layers, a plurality of word line electrodes positioned on the plurality of word line barrier layers, and a plurality of word line capping layers positioned above the plurality of word line barrier layers and the plurality of word line electrodes.

* * * * *